(12) United States Patent
Ogawa et al.

(10) Patent No.: US 6,908,779 B2
(45) Date of Patent: Jun. 21, 2005

(54) SEMICONDUCTOR DEVICE AND METHOD FOR MANUFACTURING THE SAME

(75) Inventors: Haruki Ogawa, Osaka (JP); Shuichi Nagai, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 89 days.

(21) Appl. No.: 10/342,399

(22) Filed: Jan. 15, 2003

(65) Prior Publication Data

US 2003/0136973 A1 Jul. 24, 2003

(30) Foreign Application Priority Data

Jan. 16, 2002 (JP) .................................... 2002-007275
Jun. 21, 2002 (JP) .................................... 2002-180704

(51) Int. Cl.[7] .............................................. H01L 21/00
(52) U.S. Cl. .......................................... 438/27; 438/31
(58) Field of Search ........................... 438/25, 26, 27, 438/31, 65; 257/80, 81, 82, 83, 84, 98, 99

(56) References Cited

U.S. PATENT DOCUMENTS 6,655,854 B1 * 12/2003 Nguyen et al. ............... 385/88
6,693,304 B2 * 2/2004 Nakanishi et al. ............ 257/81

FOREIGN PATENT DOCUMENTS

JP       03041405 A  *  2/1991  ............ G02B/6/12
JP       8-78657 A       3/1996
JP       10-303466 A    11/1998

OTHER PUBLICATIONS

A. Kawatani et al., "Packaging Technology for a Surface Mount Type Optical Transceiver", Technical Report of IEICP, LQE97–65 (Aug. 1997), pp. 49–54.

* cited by examiner

Primary Examiner—Douglas Wille
Assistant Examiner—Ginette Peralta
(74) Attorney, Agent, or Firm—McDermott Will & Emery LLP

(57) ABSTRACT

The present invention provides a semiconductor device in which a V-groove for holding an optical fiber and an alignment groove for adjusting the distance between the optical fiber and an optical element chip are formed in an optical fiber packaging region on the upper face of a semiconductor substrate, and an optical element chip is packaged in an optical element packaging region on the upper face of the semiconductor substrate so that its optical axis matches the direction in which the V-groove extends. A semiconductor integrated circuit is formed on the lower face of the semiconductor substrate. Through holes are provided in the optical element packaging region of the semiconductor substrate, passing from its upper face to its lower face, and the optical element chip and the semiconductor integrated circuit are connected via the through holes.

7 Claims, 14 Drawing Sheets

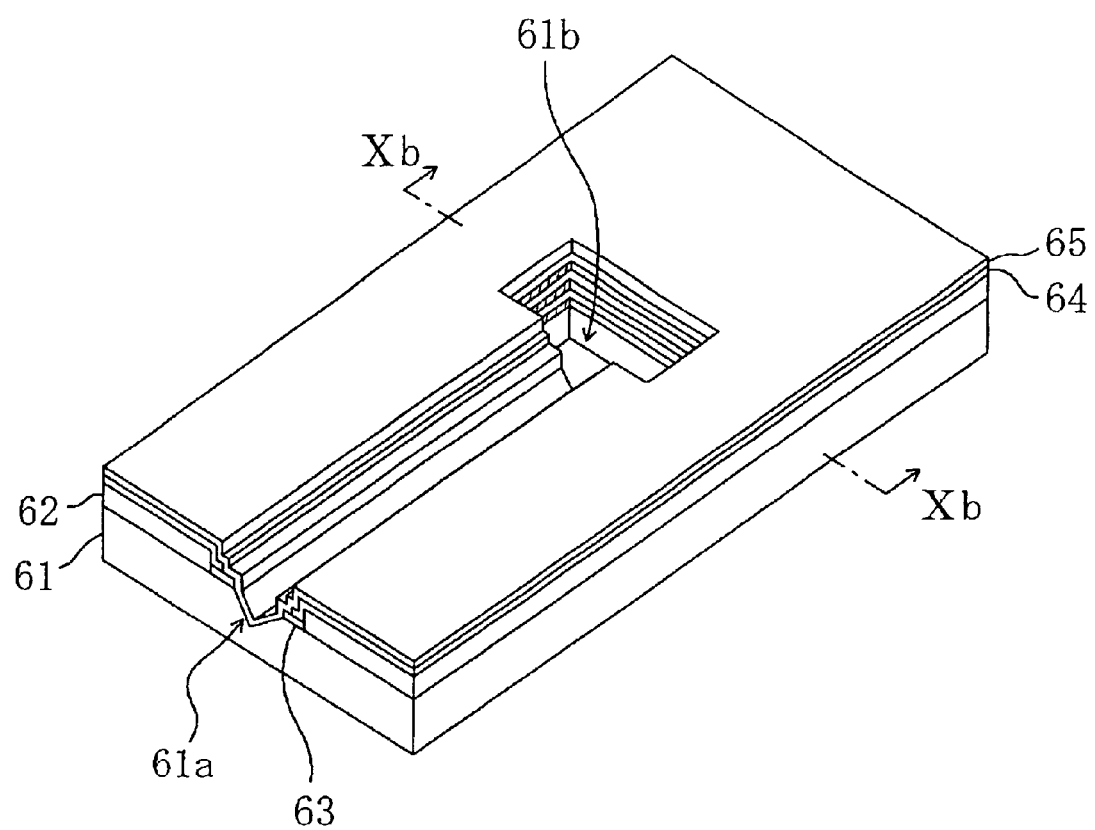
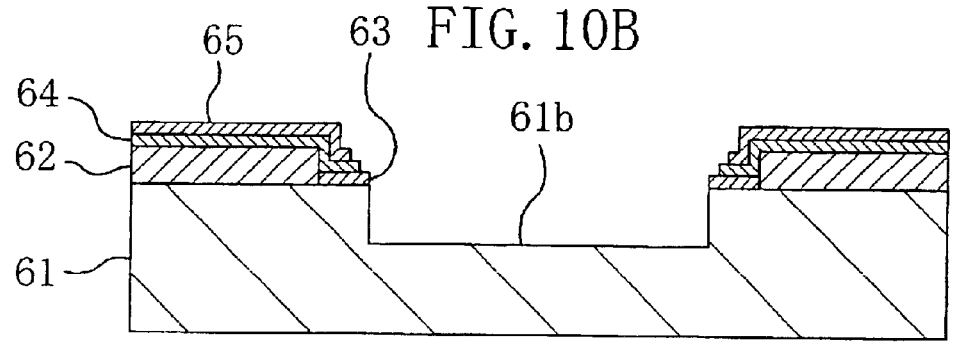

SEMICONDUCTOR DEVICE AND METHOD FOR MANUFACTURING THE SAME

BACKGROUND OF THE INVENTION

The present invention relates to semiconductor devices for sending and receiving optical signals in an optical transmission system, and more particularly relates to optoelectronic hybrid semiconductor devices including both optical elements for sending and receiving optical signals and electronic circuits for receiving, outputting, and processing electrical signals.

The enormous increase in the volume and the speed of communications in recent years has been accompanied by rapid advances in optical fiber communications. To date, high performance optical transmission systems capable of high-speed transmission have been achieved primarily for trunk lines, however, optical transmission systems available to subscribers, which are expected to be in increasing demand in the future, must not only be capable of high-speed transmission but also require lower priced and smaller semiconductor devices for sending and receiving optical signals.

A conventional method for packaging optical modules that send and receive optical signals is active alignment. With active alignment, in an optical transmission module employing a light-emitting element as an optical element, a lens is interposed between the light-emitting element and an optical fiber so as to optically couple the light-emitting device and the optical fiber. When a light-emitting element and an optical fiber are optically coupled, the optical output of the light-emitting element is monitored as the optical axes of the light-emitting element and the optical fiber are adjusted with sub-micron order precision from the end of the optical fiber that is opposite the end coupled to the light-emitting element. For this reason, a reduction in costs is difficult because packaging requires a large number of components and adjusting the optical axes is time consuming.

On the other hand, passive alignment has been developed as a planar packaging technique that allows costs to be curbed. With passive alignment, an optical element and an optical fiber are optically coupled by direct coupling without employing a lens, allowing the optical element and the optical fiber to be packaged onto a flat packaging substrate without making adjustments.

As an example, a V-shaped groove (hereinafter, referred to as a V-groove) for positioning and holding the optical fiber is provided on a silicon substrate, and an optical fiber is sandwiched and fastened in the V-groove. In addition, an optical element chip is packaged adjacent to the optical fiber. Marks for alignment are formed on the optical element chip and on the silicon substrate in advance, and these marks are used for alignment during packaging.

Consequently, the optical fiber and the optical element can be optically coupled accurately without monitoring the optical output during packaging while aligning them, and thus compared to an active alignment technique, the number of components can be reduced and costs can be reduced by shortening the packaging time.

On the other hand, attempts are also being made to reduce costs and achieve smaller sizes for semiconductor integrated circuits that connect to optical modules and that receive, output, and process electrical signals.

Examples of semiconductor integrated circuits that are connected to an optical module include, in the case of an optical transmission module employing a light-emitting element as the optical element, a light-emitting element drive circuit and a multiplexing circuit, and in the case of an optical reception module employing a light-receiving element as the optical element, a pre-amplification circuit, an equivalent amplification circuit, a timing detection circuit, an identification and reproduction circuit, and an isolation circuit.

For these semiconductor integrated circuits, lower costs and smaller sizes have been achieved by reducing the number of chips through miniaturizing and highly integrating the manufacturing processes and by reducing the packaging area by using multi-chip modules using bare chip packaging.

In an effort to further reduce costs and size and achieve higher speeds, so-called optoelectronic hybrid modules, in which a semiconductor integrated circuit for receiving, outputting, and processing electrical signals with an optical element is provided inside an optical module, have been developed. By providing the function of a light-emitting drive circuit, a multiplexing circuit, a pre-amplification circuit, an equivalent amplification circuit, a timing detection circuit, an identification and reproduction circuit, or an isolation circuit, for example, in a semiconductor integrated circuit to be packaged inside an optical module, it is possible to reduce the costs and size and raise the speed of optical transmission systems. Hereinafter, conventional examples of an optoelectronic hybrid module are described.

As a first conventional example, the optoelectronic hybrid module disclosed by Kawatani et al. ("Packaging Techniques for Surface Packaged Optical Transmission/Reception," Institute of Electronics, Communications, and Information Engineers Technical Report, LQE97-65(1997-08)) will be described with reference to the drawings.

FIG. 12 is a diagram representing the structure of the optoelectronic hybrid module disclosed by Kawatani et al. As shown in FIG. 12, in an optoelectronic hybrid module 500, a V-groove 501a is formed on a silicon substrate 501, and an optical element chip 502 and an optical fiber 503 are packaged adjacent to one another on the silicon substrate 501 and are optically coupled. The silicon substrate 501 and a semiconductor integrated circuit chip 504 are hybrid packaged onto a package 505, and the optical element chip 502 and the semiconductor integrated circuit chip 504 are connected to wiring on the package 505 by bonding wires.

Here, the V-groove 501a that is provided on the silicon substrate 501 must normally be about 2 mm in length in order to stably fasten the optical fiber 503, and thus the area of the region on the silicon substrate 501 that is required for providing the V-groove (hereinafter, referred to as the optical fiber packaging region) must be about several $mm^2$.

With this first conventional example, if only the optical element chip 502 and the optical fiber 503 are packaged on the silicon substrate 501, then the area of the silicon substrate 501 is substantially determined by the area of the optical fiber packaging region. Also, the semiconductor integrated circuit chip 504 is at least several $mm^2$ in size, and both the optical fiber packaging region and the semiconductor integrated circuit chip 504 occupy the majority of the area occupied by the optoelectronic hybrid module.

Consequently, because the silicon substrate 501 on which the V-groove 501a has been formed and the semiconductor integrated circuit chip 504 are arranged separately on the upper face of the package 505, the optoelectronic hybrid module cannot be made sufficiently small.

Also, bonding wires are used to connect the optical element chip 502 to the wiring on the silicon substrate 501 and the semiconductor integrated circuit chip 504 to the wiring on the package 505, and thus the parasitic inductance therefrom is a major obstacle to increasing the speed of signal transmission.

As a second conventional example, the optoelectronic hybrid module disclosed by Yamada et al. (JP H08-78657A, "Optic/Electronic Hybrid Packaged Substrate and Method For Manufacturing the Same, Optical Sub-Module, and Optic/Electronic Hybrid Integrated Circuit") will be described with reference to the drawings.

FIG. 13 is a diagram illustrating the structure of the optoelectronic hybrid module disclosed by Yamada et al. As shown in FIG. 13, with an optoelectronic hybrid module 600, an optical element chip 602, an optical fiber 603, and a semiconductor integrated circuit chip 604 are hybrid packaged onto the surface of a silicon substrate 601 in which a V-groove has been formed. The optical element chip 602 and the semiconductor integrated circuit chip 604 are bump-connected to wiring 605 on the silicon substrate 601 through flip-chip bonding. On the other hand, the wiring 605 on the silicon substrate 601 is connected by bonding wires to wiring provided in a package (not shown) on which the optoelectronic hybrid module 600 is placed.

According to this second conventional example, the length of the wiring connecting the optical element chip 602 and the semiconductor integrated circuit chip 604 is significantly shortened, so that compared to the first conventional example, parasitic inductance is significantly reduced, allowing for faster signal transmission speeds between the optical element chip 602 and the semiconductor integrated circuit chip 604. Also, both the V-groove for fastening the optical fiber 603 and the semiconductor integrated circuit chip 604 are mounted onto the upper face of the silicon substrate 601, and thus smaller sizes can be achieved than with the first conventional example.

However, with the second conventional example, the optical fiber packaging region, which occupies a large area, and the semiconductor integrated circuit chip 604 each occupies an area of the upper face of the silicon substrate 601, and thus a sufficient reduction in size cannot be achieved.

As a third conventional example, the optoelectronic hybrid module disclosed by Kawatani et al. (JP H10-303466A, "Optical Semiconductor Device and Method For Manufacturing the Same") is described with reference to the drawings.

FIG. 14A is a diagram illustrating the structure of the optoelectronic module disclosed by Kawatani et al., and as shown in FIG. 14A, an optoelectronic hybrid module 700 includes a silicon substrate 701 in which a V-groove 701a is formed in an optical fiber packaging region R1 and a semiconductor integrated circuit 702 is monolithically formed in an optical element packaging region R2. An optical element chip 703 is packaged onto the optical element packaging region R2 by bump-connection using flip-chip bonding. The semiconductor integrated circuit 702 is connected by a bonding wire to wiring provided in a package (not shown) on which the optoelectronic hybrid module 700 is placed.

With the configuration according to the third conventional example, the optical element chip 703 and the semiconductor integrated circuit 702 are bump-connected, and thus the speed of signal transmission between them can be increased. Also, the V-groove 701a and the semiconductor integrated circuit 702 are monolithically formed on the silicon substrate 701, allowing for a further reduction in size over the first and the second conventional examples.

However, with the optoelectronic hybrid module 700 in FIG. 14A, in order to fabricate the semiconductor integrated circuit 702 used in the optical transmission system on the silicon substrate 701, numerous complex processes with miniature processing geometry must be repeatedly performed in the process for manufacturing the semiconductor. For that reason, the manufacturing cost per unit area is more than ten times that for a silicon substrate in which only a V-groove for fastening the optical fiber and wiring are formed. Consequently, the manufacturing costs for the configuration of the third conventional example are much higher than the manufacturing costs when a silicon substrate on which only a V-groove and wiring have been formed and the semiconductor integrated circuit chip are formed independently, and this runs counter to reducing the costs of the optical transmission system.

In particular, because a predetermined area is required for the optical fiber packaging region R1 and the area of the region in which the semiconductor integrated circuit 702, which is required for using an optical element in an optical transmission system, is formed is also required, the chip becomes large in size and manufacturing costs are increased.

Also, with the third conventional example, there is a problem that it is difficult to precisely control the distance between the optical element chip 703 and the end face of the optical fiber. More specifically, in order to reduce packaging costs, the end face of the V-groove 701a on the optical element chip 703 side must be formed perpendicular to the direction in which the V-groove 701a extends so that it is possible to carry out packaging without adjustments by pressing the end face of the optical fiber against the end face of the V-groove 701a. However, with the third conventional example, the V-groove 701a is formed through etching, and thus it is difficult to perpendicularly form the end portion of the V-groove 701a on the optical element chip 703 side.

Consequently, in a practical silicon substrate 701, it is necessary to form a groove portion for adjusting the distance between the optical element chip 703 and the end face of the optical fiber in order to form a T-shape with the end portion of the V-groove 701a serving as the point of contact between them.

FIG. 14B is a perspective view showing an optoelectronic hybrid module according to the third conventional example in which an alignment groove has been provided in the semiconductor device. As shown in FIG. 14B, an alignment groove 701b has been formed in the silicon substrate 701 so as to form a T-shape with the V-groove 701a including the end portion of the V-groove 701a on the side of the optical element chip 703.

Thus, the end face of the optical fiber is pushed along the V-groove 701a so that it comes into contact with the wall of the alignment groove 701b, so that the optical axes of the optical fiber and the optical element chip 703 are aligned and the distance between the end face of the optical fiber and the optical element chip 703 can be adjusted.

However, because the alignment groove 701b is formed in a such a way that it partitions the upper face of the silicon substrate 701, if the semiconductor integrated circuit 702 is formed between the optical fiber packaging region R1 and the optical element packaging region R2, then it becomes necessary to use bonding wiring 704 to connect the semiconductor integrated circuit 702 of the optical fiber packaging region R1 and the semiconductor integrated circuit 702 of the optical element packaging region R2. Consequently, the transmission speed of the semiconductor device is lowered by parasitic inductance of the bonding wiring 704.

On the other hand, when a configuration is adopted in which the bonding wiring 704 is not used so as to ensure the transmission speed of the semiconductor device, the semiconductor integrated circuit 702 is formed having increased area in the optical element packaging region R2, which increases the chip size and raises manufacturing costs.

Thus, there is the problem that it is difficult to simultaneously achieve smaller size, lower costs, and higher speeds with the optoelectronic hybrid modules of the first through third conventional examples.

SUMMARY OF THE INVENTION

The present invention solves these conventional problems, and it is an object thereof to reliably obtain a high-performance optoelectronic hybrid semiconductor device that is small in size, low cost, and high-speed.

To achieve the above object, a first semiconductor device of the invention is provided with a semiconductor substrate having a first face that includes a first region and a second region and a second face in opposition to the first face, an optical element provided on the first region of the first face, a first groove formed in the second region of the first face of the semiconductor substrate and extending substantially parallel to an optical axis of the optical element, an electronic circuit formed on the second face side of the semiconductor substrate, and a first wiring for connecting the optical element and the electronic circuit.

With the first semiconductor device according to the invention, utilizing the first face and the second face of the semiconductor substrate allows the number of devices that can be packaged on the semiconductor device to be increased and allows the volume of the semiconductor device to be reduced. Furthermore, according to the invention, the optical element and the electronic circuit are connected by the first wiring, which allows the effects of parasitic inductance to be significantly reduced over a case in which bonding wires are used for the connection. Consequently, the transfer of signals between the electronic circuit and the optical element can be increased in speed. That is, the optical element and the electronic circuit can be provided at a high degree of integration, allowing a semiconductor device capable of high-speed operation to be obtained.

It is preferable that the first semiconductor device of the invention further includes an optical fiber fastened in the first groove.

It is preferable that in the first semiconductor device of the invention, the semiconductor substrate has a through hole in the first region that passes from the first face to the second face, and that the first wiring passes through the through hole and connects the optical element and the electronic circuit.

Thus, the first wiring that connects the optical element and the electronic circuit can be shortened, and this allows the wiring resistance to be reduced and a semiconductor device that is capable of faster operation to be obtained.

It is preferable that in the first semiconductor device of the invention, the semiconductor substrate has a recessed portion for optical fiber alignment that is formed in the first face and is positioned at an end portion of the first groove on the side of the optical element.

It is preferable that in the first semiconductor device of the invention, the recessed portion is a second groove formed substantially perpendicular to the first groove.

It is preferable that in the first semiconductor device of the invention, the recessed portion is a through hole that passes from the first face to the second face, and that the first wiring passes through the through hole and connects the optical element and the electronic circuit.

It is preferable that in the first semiconductor device of the invention, the electronic circuit includes a semiconductor integrated circuit formed on the second face side of the semiconductor substrate, and a semiconductor chip that is bump-connected to the semiconductor integrated circuit.

It is preferable that in the first semiconductor device of the invention, the electronic circuit has a second wiring formed on the second face side of the semiconductor substrate, and a semiconductor chip that is bump-connected to the second wiring.

It is preferable that the first semiconductor device of the invention further includes a package having a third wiring connected to an outside circuit and an insulating film formed on the electronic circuit, and that the electronic circuit is bump-connected to the third wiring of the package and the insulating film is bump-connected to the package.

By doing this, the heat that is generated during operation of the optical element and the electronic circuit can be effectively dissipated to the surface of the package through the bumps between the insulating film and the package, and thermal resistance can be significantly reduced. As a result, extreme rises in temperature can be prevented during operation of the semiconductor device. Consequently, the operation of the semiconductor device is stabilized and becomes more reliable.

It is preferable that the first semiconductor device of the invention further includes a package having a protruding portion and a third wiring connected to an outside circuit; and an insulating film formed on the electronic circuit, and that the electronic circuit the third wiring of the package are bump-connected and the insulating film and the protruding portion are in contact.

By doing this, the heat that is generated during operation of the optical element and the electronic circuit can be effectively dissipated to the surface of the protruding portion of the package, and thermal resistance can be significantly reduced. As a result, extreme rises in temperature can be prevented during operation of the semiconductor device. Consequently, the operation of the semiconductor device is stabilized and becomes more reliable.

It is preferable that in the first semiconductor device of the invention, the semiconductor substrate is made of silicon.

It is preferable that in the first semiconductor device of the invention, the semiconductor substrate is made of gallium arsenide.

It is preferable that in the first semiconductor device of the invention, the semiconductor substrate is made of indium phosphide.

A first semiconductor device manufacturing method according to the invention includes a first step of preparing a semiconductor substrate having a first face that includes a first region and a second region and a second face in opposition to the first face, a second step of forming an electronic circuit on the second face side of the semiconductor substrate, a third step of forming an optical fiber fastening groove in the second region of the first face of the semiconductor substrate, and then forming a through hole that passes from the first face to the second face in the first region of the first face of the semiconductor substrate, a fourth step of forming an insulating film on the second region of the first face and on the lateral face of the through hole, and then forming a wiring on the insulating film, a fifth step of connecting the electronic circuit and the wiring, and a sixth step of connecting an optical element to the wiring formed on the second region of the first face so that its optical axis is parallel to the optical fiber fastening groove.

According to the first semiconductor device manufacturing method of the invention, utilizing the both the first and the second faces of the semiconductor substrate allows the number of devices that can be mounted onto the substrate to be increased and allows the volume of the semiconductor substrate to be reduced.

Also, because the optical element and the electronic circuit are connected by the first wiring, the effects of parasitic inductance can be significantly reduced over a case in which they are connected by bonding wires. Consequently, the transfer of signals between the electronic circuit and the optical element can be increased in speed. That is, the optical element and the electronic circuit can be provided at a high degree of integration, allowing a semiconductor device capable of high-speed operation to be obtained.

Moreover, because both the first and the second faces of the semiconductor substrate are utilized, there is area to spare after an electronic circuit of the scale required for an optical transmission system is formed. Thus, complex steps in which the processing geometry is tiny can be reduced in the processing for forming the electronic circuit, which allows manufacturing costs to be reduced.

In the first semiconductor device manufacturing method of the invention, it is preferable that in the second step, a thermal oxide film is formed on an upper face of the semiconductor substrate when a thermal oxide film is formed on a lower face of the semiconductor substrate, and that in the third step, a thermal oxide film mask is formed by patterning the thermal oxide film on the upper face of the semiconductor substrate, after which the optical fiber fastening groove and the through hole are formed by wet etching using the thermal oxide film mask.

Thus, the thermal oxide film is much more closely adhered to the semiconductor substrate than in a case where the film is formed by a different method such as CVD, and therefore hardly any side etching occurs if the thermal oxide film is used as an etching mask during wet etching. Consequently, by precisely controlling the shape of the patterned thermal oxide film, the optical fiber fastening groove and the through hole, which are etched to different depths, can be formed into a desired shape with extremely high precision in a single etching.

A second semiconductor device according to the invention is provided with a semiconductor substrate, a groove portion formed in an upper face of the semiconductor substrate and extending from an end portion to a center portion of the semiconductor substrate, a recessed portion formed in the upper face of the semiconductor substrate, whose lateral portion is connected to the end portion of the groove portion on the central portion side of the semiconductor substrate, and which has a wall face opposite the groove portion that is formed substantially perpendicular to the direction in which the groove portion extends, an electronic circuit formed on the upper face of the semiconductor substrate in a region to the side of the groove portion and in a region on the side of the recessed portion that is opposite the groove portion, and an optical element formed on the semiconductor substrate in a region on the side of the recessed portion that is opposite the groove portion, so that its optical axis matches the direction in which the groove portion extends, and which is electrically connected to the electronic circuit, and a dimension of an opening of the recessed portion is smaller than the dimension of the semiconductor substrate in the direction perpendicular to the direction in which the groove portion extends.

With the second semiconductor device of the invention, the optical axes of the optical fiber and the optical element are adjusted using the groove portion and the recessed portion, and the recessed portion can be formed spaced from the lateral faces of the semiconductor substrate. Consequently, the upper face of the semiconductor substrate is contiguous in the direction that the groove portion extends on at least one side of the groove portion, and the electronic circuit that is formed in a region to the side of the groove portion of the semiconductor substrate can be electrically connected to the electronic circuit that is formed in a region on the side of the recessed portion in opposition to the groove portion without using bonding wires, and thus it is possible to reduce the size and the costs and increase the speed of the semiconductor device.

In the second semiconductor device of the invention, it is preferable that the recessed portion is formed having at least one of its end portions spaced from a lateral face of the semiconductor substrate, and extends in a direction substantially perpendicular to the groove portion, and that the electronic circuit is formed contiguous with the region to the side of the groove portion and the region around the recessed portion on the upper face of the semiconductor substrate.

Thus, the upper face of the semiconductor substrate can be effectively utilized in forming the electronic circuit, so that a reduction in the size and costs of the semiconductor device can be reliably achieved.

It is preferable that the second semiconductor device of the invention further includes a first insulating film formed around the recessed portion and the groove portion on the semiconductor substrate, a second insulating film formed on the electronic circuit and on the first insulating film, and a third insulating film formed on the wall face of the groove portion.

A second semiconductor device manufacturing method according to the invention includes a first step of forming a first mask film on a groove portion formation region and a recessed portion formation region of a semiconductor substrate, a second step of forming an electronic circuit at a region of the semiconductor substrate other than the groove portion formation region and the recessed portion formation region, a third step of forming a second mask film over the entire surface of the semiconductor substrate, including over the electronic circuit and the first mask film, a fourth step of exposing the groove portion formation region of the semiconductor substrate by patterning the second mask film and the first mask film in that order, a fifth step of forming a groove portion by etching the groove portion formation region using the first mask film and the second mask film, a sixth step of forming a third mask film over the entire surface of the semiconductor substrate, including over the groove portion and the second mask film, a seventh step of exposing the recessed portion formation region of the semiconductor substrate by patterning the third mask film, the second mask film, and the first mask film in that order, and an eighth step of forming a recessed portion by etching the recessed portion formation region using at least the first mask film and the third mask film.

With the second semiconductor device manufacturing method of the invention, not only can be semiconductor device be reduced in size and chip costs reduced, but the electronic circuit can be contiguously formed in the region to the side of the groove portion of the semiconductor substrate and the region on the side opposite the groove portion of the semiconductor substrate without using bonding wires, and thus a semiconductor device capable of higher speeds can be obtained.

In the second semiconductor device manufacturing method of the invention, it is preferable that the semiconductor substrate and the first mask film are made of silicon and silicon oxide, respectively.

In the second semiconductor device manufacturing method of the invention, it is preferable that the first step is carried out together with a thermal oxidation step for forming structural components of the electronic circuit of the second step.

Thus, the step for forming the first mask film can be simplified and manufacturing costs can be reduced. Also, the semiconductor substrate and the first mask film are very closely adhered because the first mask film is formed as a thermal oxide film, and this makes it unlikely that side etching will occur when forming the groove portion in the fifth step.

In the second semiconductor device manufacturing method of the invention, it is preferable that the second mask film is made of silicon nitride and the fifth step is carried out by wet etching using a potassium hydroxide solution.

Thus, the semiconductor substrate is reliably protected by the first mask film, and thus side etching does not occur during wet etching and the groove portion can be provided with very high precision. Also, the second mask film allows the electronic circuit to be protected from etching damage.

In the second semiconductor device manufacturing method of the invention, it is preferable that the third mask is made of silicon oxide and that the eighth step is carried out by dry etching using an etching gas that includes sulfur fluoride, hydrogen bromide, and oxygen.

Thus, not only it is possible to rapidly etch the semiconductor substrate using sulfur fluoride, but the wall face that is formed through etching is protected by the reaction product with hydrogen bromide, and thus a recessed portion having a flat wall face can be reliably provided. Also, the groove portion can be protected by the third mask at the time of etching, and the groove portion and the recessed portion can be reliably provided.

BRIEF DESCRIPTION OF THE DRAWINGS

FIG. 10A is a perspective view showing steps of the method for manufacturing the optoelectronic hybrid module according to the eighth embodiment of the invention, and FIG. 10B is a cross-sectional view taken along the line Xb—Xb in FIG. 10A.

DETAILED DESCRIPTION OF THE INVENTION

First Embodiment

Figure 1A:
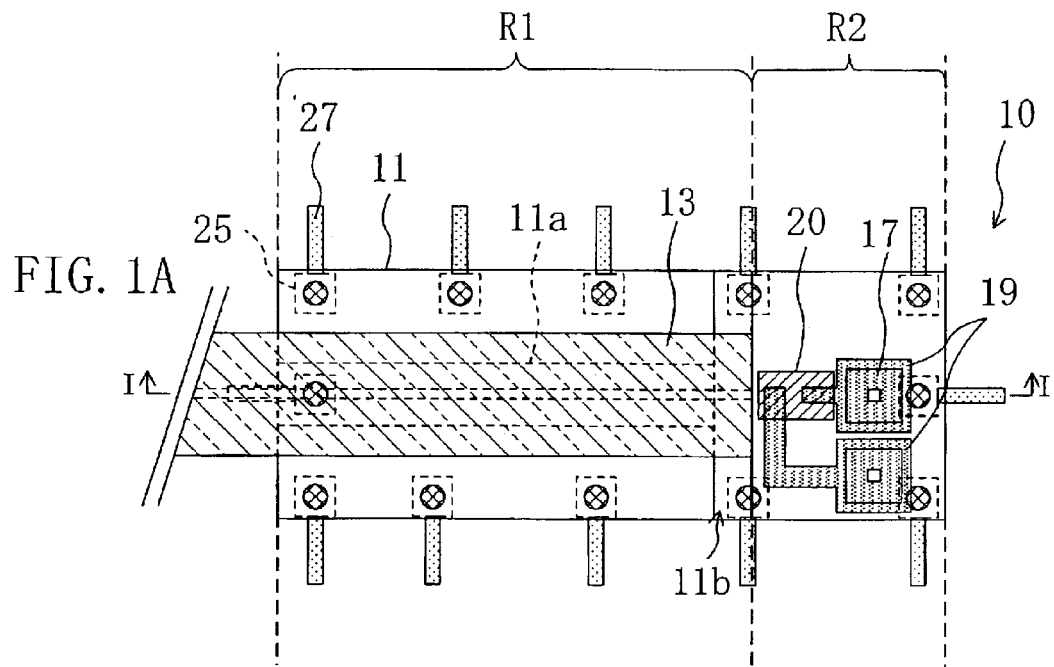
FIG. 1A is a plan view showing the optoelectronic hybrid module according to a first embodiment of the invention.
Figure 1B:
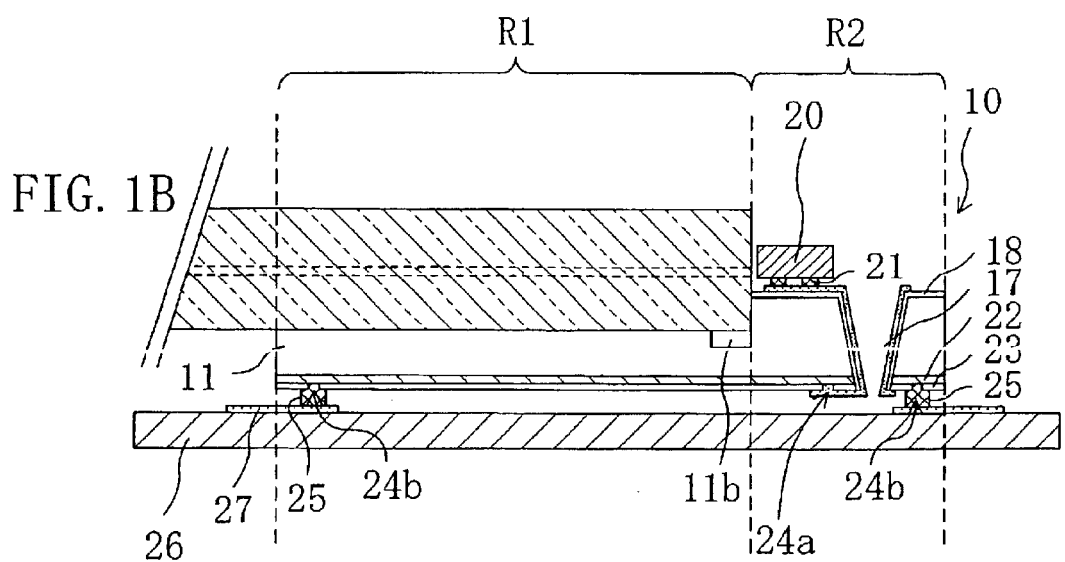
FIG. 1B is a cross-sectional view taken along the I—I line in FIG. 1A.

A first embodiment of the invention is described with reference to the drawings. FIG. 1A is a top view of an optoelectronic hybrid module for optical transmission, in which a semiconductor laser is used as the light-emitting element. FIG. 1B is a cross-sectional view taken along the line I—I in FIG. 1A.

As shown in FIGS. 1A and 1B, an optoelectronic hybrid module 10 according to the first embodiment is provided with a silicon substrate 11, an optical fiber 13, a semiconductor laser chip 20, a semiconductor integrated circuit 22, and a package 26 made of ceramic.

The silicon substrate 11 is provided with an optical fiber packaging region R1 and an optical element packaging region R2 on its upper face. A V-groove 11a for mounting an optical fiber 13 is provided in the optical fiber packaging region R1, and an alignment groove 11b is formed at the end portion of the V-groove 11a and is substantially perpendicular to the V-groove 11a.

Here, the V-groove 11a extends at a substantially uniform depth parallel to the upper face of the silicon substrate 11. Also, the alignment groove 11b extends substantially perpendicularly to the direction in which the V-groove 11a extends, and its wall face is formed flat and substantially perpendicular to the upper face of the silicon substrate 11. Consequently, the wall face of the alignment groove 11b on the side opposite the V-groove 11a is substantially perpendicular to the direction in which the V-groove 11a extends.

The end of the optical fiber 13 is pressed against the wall face of the alignment groove 11b, and the optical fiber 13 is fixed in the V-groove 11a aligned in the axial direction.

Through holes 17 are formed in the optical element packaging region R2, passing from the upper face to the lower face. A silicon oxide film 18 is formed on the upper face of the optical element packaging region R2 and on the lateral face of the through holes 17, and wiring 19 made of an alloy of chrome and gold (CrAu) is formed on the silicon oxide film 18.

Solder bumps 21 made of a lead-tin alloy (PbSn) are formed on the semiconductor laser chip 20, and are connected to the wiring 19 by flip-chip bonding near the tip of the optical fiber 13.

A semiconductor integrated circuit 22 is formed on the lower face of the silicon substrate 11. The semiconductor integrated circuit 22 is provided with Al electrodes (not shown).

A passivation film 23 made of silicon nitride is formed on the semiconductor integrated circuit 22, and is provided with contact holes 24a and 24b that lead to the Al electrodes of the semiconductor integrated circuit 22. The semiconductor integrated circuit 22 is connected to the wiring 19, which is connected to the semiconductor laser chip 20, via the contact holes 24a provided in the passivation film 23. Also, solder bumps 25 made of PbSn are formed at the contact holes 24b.

Wiring 27 is formed on the package 26 made of ceramic, and is connected to an outside circuit (not shown).

The semiconductor integrated circuit 22 is connected to the wiring 27, which is formed on the package 26 made of ceramic, by flip-chip bonding using the solder bumps 25. Thus, the semiconductor integrated circuit 22 is connected to the outside circuit, which means that the optoelectronic hybrid module 10 is connected to the outside circuit.

The optoelectronic hybrid module 10 of the first embodiment is much smaller than the conventional optoelectronic modules. That is, utilizing both the upper and lower faces of the silicon substrate 11 allows the number of devices that can be mounted onto the silicon substrate 11 to be increased, or alternatively allows the size of the optoelectronic hybrid module to be reduced. In other words, it is possible to obtain an optoelectronic hybrid module with which optical elements and semiconductor integrated circuits are packaged very highly integrated.

For example, if the area that is required for forming the semiconductor integrated circuit 22 is substantially equal to the sum of the area of the optical fiber packaging region R1 and the optical element packaging region R2, then the size of the silicon substrate 11 can be reduced to about half that of a case in which they are formed on the upper face of the silicon substrate 11.

In place of the alignment groove 11b that is used for alignment in the axial direction of the optical fiber, it is also possible to provide a recessed portion having a wall face against which the tip of the optical fiber is pressed. In particular, if a through hole is formed in the end of the V-groove 11a as a recessed portion, then this through hole can be used for alignment and the through holes 17 that are formed in the optical element packaging region R2 can be obviated. This allows the optoelectronic hybrid module to be even further reduced in size.

Also, in the first embodiment, only the semiconductor laser chip 20 is provided on the optical element packaging region R2, however, it is also possible to further provide other electronic devices, such as chip resistors and capacitors.

Furthermore, with the optoelectronic hybrid module 10 of the first embodiment, the semiconductor laser chip 20 and the semiconductor integrated circuit 22 are connected by the wiring 19 that is formed in the through holes 17, and thus the effects of parasitic inductance can be significantly reduced over a connection using bonding wires. Consequently, the semiconductor laser chip 20 can be driven at higher speeds by the semiconductor integrated circuit 22.

Also, the semiconductor integrated circuit 22 is connected to the wiring 27 on the ceramic package, which is connected to the outside circuit, using the solder bumps 25, and thus the effects of parasitic inductance can be significantly reduced. Consequently, the speed of signal transfer between the semiconductor integrated circuit 22 and the outside circuit can be increased.

With the optoelectronic hybrid module 10 of the first embodiment, the semiconductor laser chip 20 and the semiconductor integrated circuit 22 are connected via the wiring 19 that passes through the through holes 17, which pass from the upper face to the lower face of the silicon substrate 11. However, there is no limitation to this, and any means can be used therefor as long as the semiconductor laser chip 20 and the semiconductor integrated circuit 22 are connected. For example, it is possible to not form the through holes 17 and instead provide wiring that traverses a lateral face of the silicon substrate 11 to connect the semiconductor laser chip 20 and the semiconductor integrated circuit 22.

However, by forming the through holes 17 shown in FIGS. 1A and 1B, the semiconductor laser chip 20 and the semiconductor integrated circuit 22 can be connected via the through holes 17, and thus the length of the wiring 19 between the semiconductor laser chip 20 and the semiconductor integrated circuit 22 can be shortened. This allows wiring inductance and wiring resistance to be further reduced, obtaining an optoelectronic hybrid module that is better suited for high-speed signal transmission.

Next, a method for manufacturing the optoelectronic hybrid module 10 of this embodiment is described with reference to the drawings.

FIGS. 2A to 3B are top views and cross-sectional views showing various steps of the method for manufacturing the optoelectronic hybrid module of the first embodiment. In FIGS. 2A to 3B, structural components that are identical to those shown in FIGS. 1A and 1B are assigned identical reference numerals and will not be described.

Figure 2A:
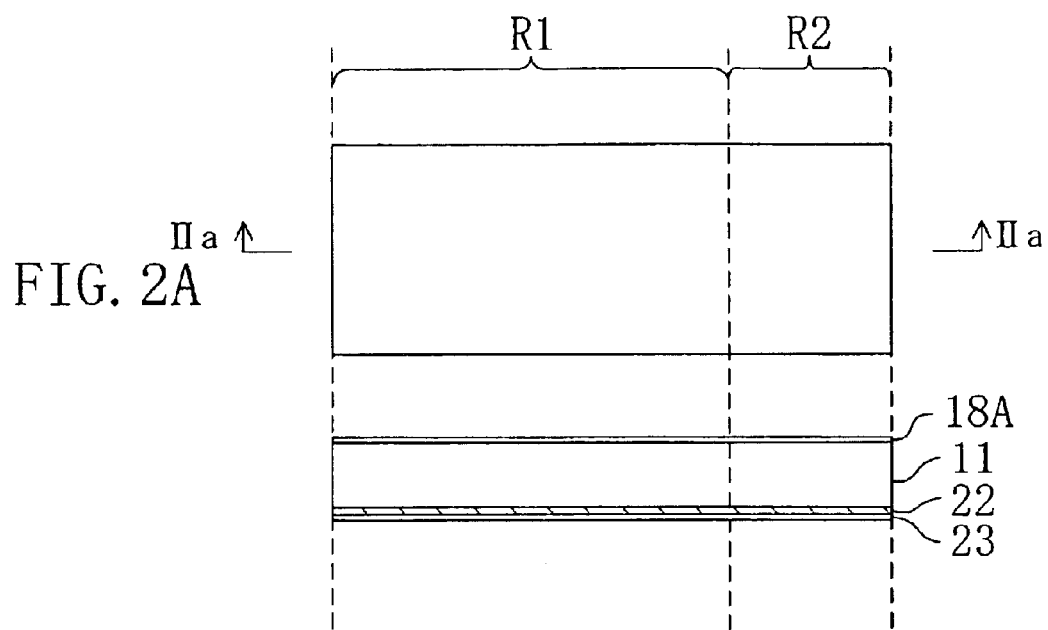
FIGS. 2A and 2B are top and cross-sectional views showing steps of a manufacturing method for the optoelectronic hybrid module according to the first embodiment of the invention.
Figure 2B:
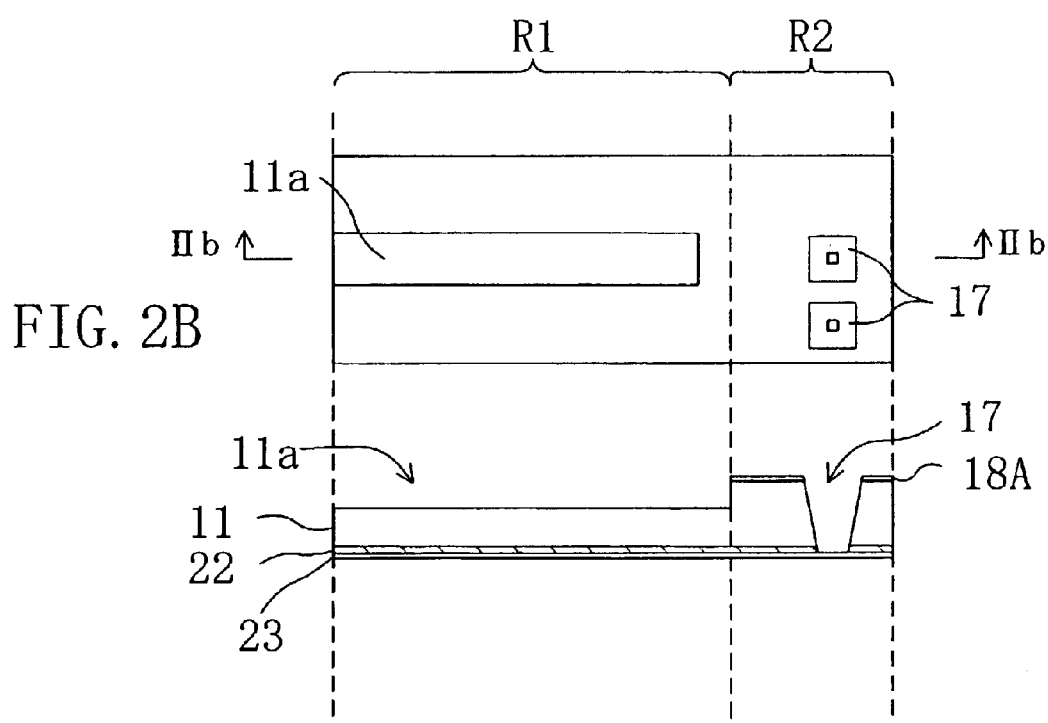
Figure 3A:
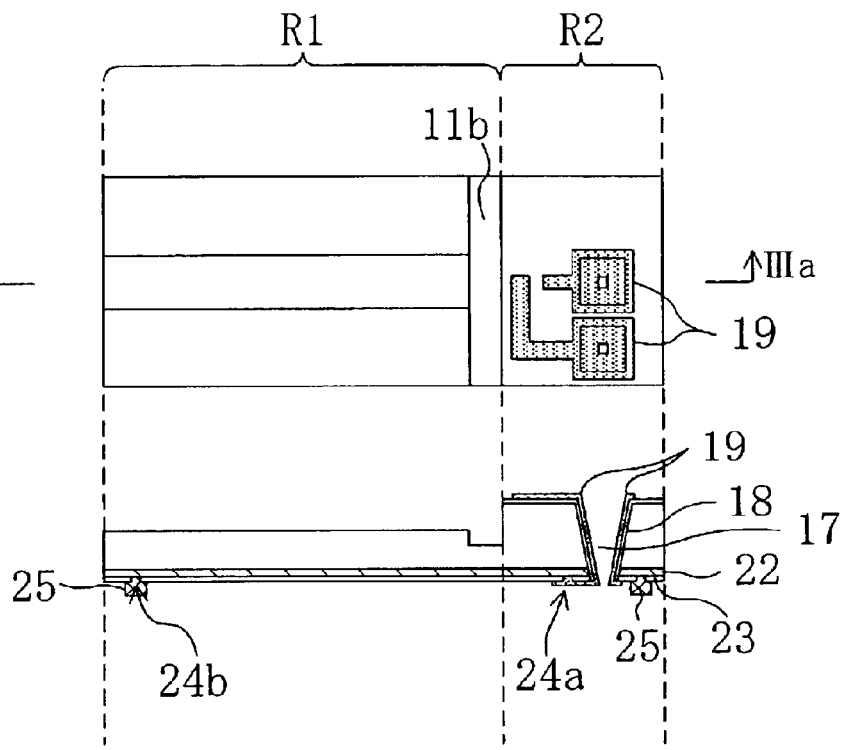
FIGS. 3A and 3B are top and cross-sectional views showing steps of a manufacturing method for the optoelectronic hybrid module of the invention.
Figure 3B:
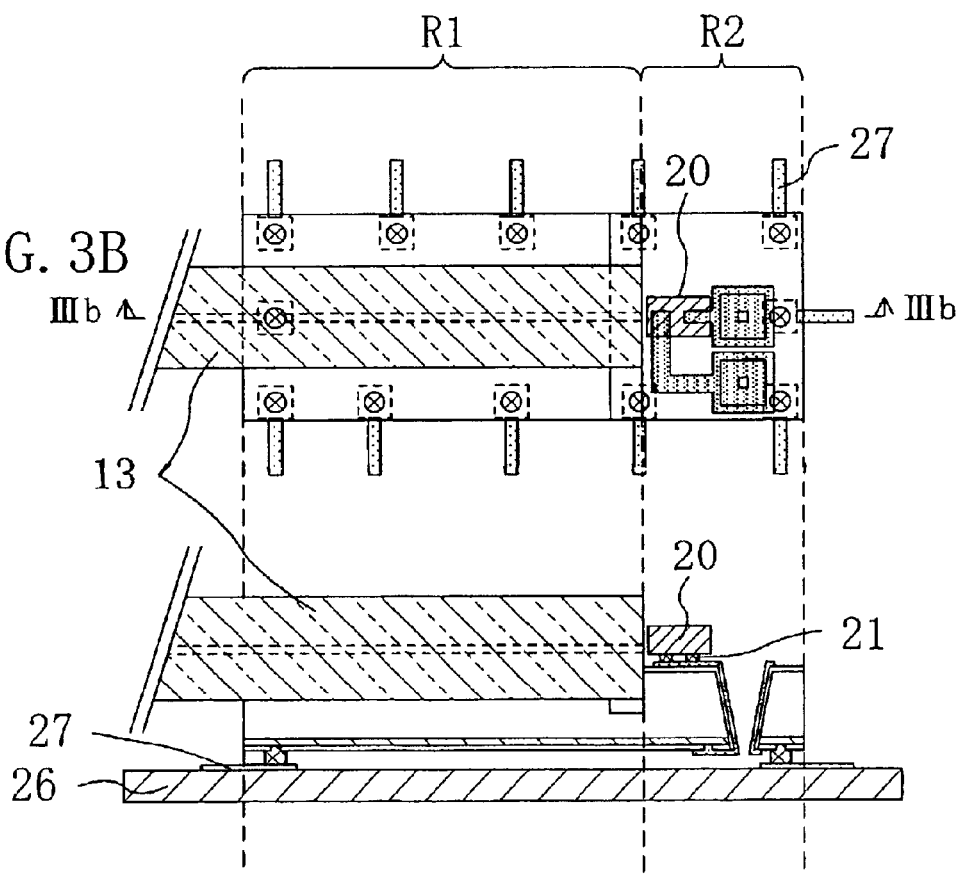

It should be noted that the cross-sectional views FIGS. 2A and 2B show the cross section configuration taken along the lines IIa—IIa and IIb—IIb shown in the top views FIGS. 2A and 2B, respectively. Also, the cross-sectional views FIGS. 3A and 3B show the cross section configuration taken along the lines IIIa—IIIa and IIIb—IIIb shown in the top views FIGS. 3A and 3B, respectively.

First, in the step shown in FIG. 2A, a silicon substrate 11 whose crystal orientation is such that its lower face is a {100} face is prepared. Next, the semiconductor integrated circuit 22 is formed on the lower face of the silicon substrate 11.

Here, the formation of the semiconductor integrated circuit 22 in the step shown in FIG. 2A is described in detail.

In the process for forming the semiconductor integrated circuit 22, in order to form a silicon oxide film to serve as the gate insulating film of a FET, for example, when a silicon oxide film is formed on the lower face of the silicon substrate 11 by thermal oxidation of the lower face of the silicon substrate 11, a silicon oxide film 18A is formed also on the upper face of the silicon substrate 11. Next, a resist is applied to the upper face of the silicon substrate 11 so that the silicon oxide film 18A on the upper face of the silicon substrate 11 is not removed in the oxide film removal step that is performed later.

After the semiconductor integrated circuit 22 has been formed, a passivation film 23 for ensuring the reliability of the semiconductor integrated circuit 22 is formed on the semiconductor integrated circuit 22.

Next, in the step shown in FIG. 2B, the V-groove 11a for optical fiber mounting is formed in the optical fiber packaging region R1 on the upper face of the silicon substrate 11, and the through holes 17 are formed in the optical element packaging region R2, passing from the upper face to the lower face. In the first embodiment, the V-groove 11a and the through holes 17 are formed simultaneously, however, the V-groove 11a and the through holes 17 can also be formed separately.

In this step, the silicon oxide film 18A that has been formed on the upper face of the silicon substrate 11 is patterned by photolithography and wet-etching using buffered HF, and with this patterned silicon oxide film 18A serving as a mask, the silicon substrate 11 is subjected to anisotrophic etching using a KOH solution. The passivation film 23 is hardly etched by the KOH solution, and thus the semiconductor integrated circuit 22 is protected.

With the anisotrophic etching performed at this time, the speed at which the {111} face is etched is much slower than the speed at which faces with other orientations are etched. For this reason, etching has substantially stopped at the point that the {111} face is exposed. Also, the silicon oxide film 18A that is formed through thermal oxidation adheres to the silicon substrate 11 much more strongly than a silicon oxide film formed through other methods such as CVD, and thus hardly any side etching occurs if the silicon oxide film 18A is used as the etching mask for the silicon substrate 11. Consequently, by precisely controlling the shape of the silicon oxide film 18A that is patterned, it is possible to simultaneously form the V-groove 11a and the through holes 17, which are etched to different depths, into desired shapes with extremely high precision.

Next, in the step shown in FIG. 3A, the silicon oxide film 18 is formed by plasma CVD on the surface of the optical element packaging region R2 and on the lateral face of the through holes 17 as an electrical insulator. Then, upper side wiring made of metal film is formed on the silicon oxide film 18 that has been formed on the surface of the optical element packaging region R2 and on the lateral face of the through holes 17, extending along the wall of the through holes 17 from the upper face of the optical element packaging region R2 to the lower face side of the silicon substrate 11. Here, the upper side wiring becomes the portion of the wiring 19 shown in FIGS. 1A and 1B that is formed on the upper face of the silicon substrate 11 and on the wall face of the through holes 17.

Here, the upper side wiring is formed through the following method. First, a resist pattern open at a wiring formation region is formed through photolithography, and then a metal film made of CrAu is formed on the upper face of the silicon substrate 11, including on the resist pattern, through a vacuum deposition method. Next, the resist pattern is lifted off, and the metal film is patterned. Thus, the upper side wiring is formed from the metal film.

This is followed by dicing the upper portion of the silicon substrate 11 perpendicular to the direction in which the V-groove Ha extends, so as to form the alignment groove 11b that is used in aligning the axial direction of the optical fiber. The alignment groove 11b is formed including the end of the V-groove 11a on the optical element packaging region R2 side.

Next, the passivation film 23 is selectively removed by photolithography and dry etching, forming the contact holes 24a and 24b. The portions of the passivation film 23 that block the bottom of the through holes 17 are also removed at this time.

Then, lower side wiring made of CrAu is formed on the lower face of the passivation film 23 in the same way as the upper side wiring mentioned above, and connects the semiconductor integrated circuit 22 and the wiring pattern extending along the through holes via the contact holes 24a. Here, the lower side wiring becomes the portion of the wiring 19 shown in FIGS. 1A and 1B that is formed on the lower face of the silicon substrate 11. Thus, the wiring 19 extends from the upper face of the optical element packaging region R2 along the wall face of the through holes 17 and is connected to the semiconductor integrated circuit 22.

Next, the solder bumps 25 made of PbSn are formed on the Al electrode exposed at the bottom portion of the contact holes 24b through vapor deposition using a metal mask.

Then, in the step shown in FIG. 3B, the wafer obtained through the above processing is separated by dicing into chips of the semiconductor substrate. Then, the package 26 made of ceramic, in which the wiring 27 connected to an outside circuit has been formed, is readied and the silicon substrate 11 is packaged onto the package 26 made of ceramic through flip-chip bonding.

Next, the semiconductor laser chip 20, which has been provided with solder bumps 21 made of PbSn, is connected by flip-chip bonding to the end portion of the wiring 19 in the optical element packaging region R2.

The optical fiber 13 is then mounted in the V-groove 11a. A passive alignment technique is employed at this time to align the optical axes of the semiconductor laser chip 20 and the optical fiber 13.

In order to fabricate semiconductor integrated circuits on the scale required by optical transmission systems, in the course of the semiconductor manufacturing process it is necessary to repeat numerous complex processes at a miniature processing geometry, leading to high manufacturing costs per unit area. In particular, in the third conventional example, the V-groove and the semiconductor integrated circuit are monolithically formed on the silicon substrate, and thus the manufacturing costs per unit area of the optical fiber packaging region R1 are the same as for the semiconductor integrated circuit, and this significantly increases manufacturing costs.

However, with the manufacturing method for the optoelectronic hybrid module of the first embodiment, the semiconductor integrated circuit 22 is formed on the lower face of the silicon substrate 11, and thus the lower surface of the optical fiber packaging region R1 of the silicon substrate 11 is available for the major part of the semiconductor integrated circuit 22. That is, the available area (effective area) on the silicon substrate 11 can be increased. Consequently, the optoelectronic hybrid module can be made smaller and costs can be significantly reduced.

Also, if the silicon substrate 11 is the same size as the silicon substrate 701 of the third conventional example, then the semiconductor integrated circuit can be made larger in scale, which allows for increased performance.

Moreover, there is effective area to spare on the silicon substrate 11 after a semiconductor integrated circuit on the scale required for an optical transmission system has been formed, and thus the number of complex processes with miniature processing geometries among the processes for forming the semiconductor integrated circuit can be reduced. Consequently, manufacturing costs can be reduced over those of the third conventional example.

Also, with the method of manufacturing the optoelectronic hybrid module of the first embodiment, the silicon oxide film 18 that is formed by thermal oxidation during processing of the Si semiconductor in order to form the semiconductor integrated circuit 22 is used as an etching mask when the V-groove 11a and the through holes 17 are formed. For this reason, the silicon oxide film 18 can be precisely patterned into a desired shape when the silicon substrate 11 is etched through anisotrophic etching using a KOH solution. Consequently, the V-groove 11a and the through holes 17, which have different depths, can be formed into desired shapes with extreme precision, even if they are formed at the same time.

It should be noted that in the manufacturing method for the optoelectronic hybrid module according to the first embodiment, in the course of the processing shown in FIG. 3A, the alignment groove 11b, which is used for alignment in the axial direction of the optical fiber, is formed by dicing. There is no limitation to this, however, and in place of the alignment groove 11b, it is possible to form a recessed portion having a wall face against which the tip of the optical fiber is pressed. In particular, if a through hole is formed at the end portion of the V-groove 11a as the recessed portion, then this through hole can be used for the purpose of alignment, and in addition the through holes 17 that are formed in the optical element packaging region R2 can be obviated. Thus, the optoelectronic hybrid module can be further reduced in size.

Also, in the first embodiment, a semiconductor laser chip was used as the optical element, but a light-emitting element such as a light-emitting diode or a light-receiving element such as a PIN photodiode or an avalanche diode can also be used.

Also, the through holes 17 are formed at the same time as the V-groove 11a through anisotrophic wet etching, but they may also be formed separately and/or may also be formed through other methods, such as dry etching.

Also, the silicon oxide film 18 formed through thermal oxidation is employed as an etching mask when the V-groove 11a is formed, however, it is also possible to use a silicon oxide film formed through other methods, such as plasma CVD, or to use another insulating film, such as silicon nitride.

Also, the silicon oxide film 18 may be another type of insulating film. Moreover, the material of the passivation film 23 is not restricted to silicon nitride, and other materials having similar properties (such as silicon oxide) can also be used.

Also, PbSn was used as the material for the solder bumps 21 and 25, but other materials having similar properties (such as AuSn) can be used. Moreover, CrAu was used as the material for the wiring, but other materials having similar properties (such as TiAu) can be used.

Furthermore, the silicon substrate 11 was packaged in the ceramic package 26, but it can also be packaged in a package made of a different material or directly mounted onto a circuit board such as a print board.

Second Embodiment

Hereinafter, as a second embodiment of the invention, a modified example of the optoelectronic hybrid module 10 of the first embodiment is described with reference to the drawings.

Figure 4:
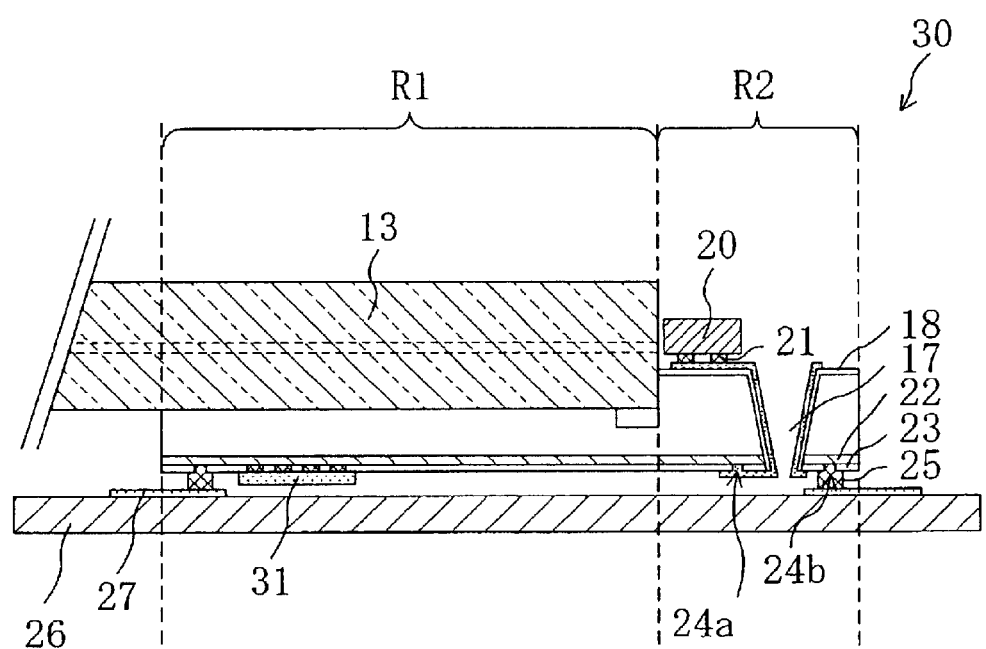
FIG. 4 is a cross-sectional view showing the optoelectronic hybrid module according to a second embodiment of the invention.

FIG. 4 is a cross-sectional view of the optoelectronic hybrid module according to the second embodiment. In FIG. 4, structural components that are identical to those shown in FIGS. 1A and 1B are assigned identical reference numerals and description thereof is omitted.

A top view of an optoelectronic hybrid module 30 according to the second embodiment is substantially identical to FIG. 1A of the first embodiment. That is, the optoelectronic hybrid module 30 of the second embodiment has substantially the same configuration as the optoelectronic hybrid module 10 according to the first embodiment. However, comparing FIG. 1A of the first embodiment and FIG. 4 of the second embodiment will reveal that the optoelectronic hybrid module 30 differs from the optoelectronic hybrid module 10 according to the first embodiment in that a semiconductor chip 31 has been further provided bump-connected to the semiconductor integrated circuit 22 by flip-chip bonding. The semiconductor chip 31 is provided with a semiconductor integrated circuit for signal processing.

According to the second embodiment, the semiconductor chip 31 can be provided on the semiconductor integrated circuit 22. Consequently, a larger number of semiconductor integrated circuits can be installed using a silicon substrate that is exactly the same size as that of the optoelectronic hybrid module 10 of the first embodiment.

It should be noted that the optoelectronic hybrid module 30 of the second embodiment includes the semiconductor integrated circuit 22 and the semiconductor integrated circuit provided on the semiconductor chip 31, however, it is also possible to form wiring in place of the semiconductor integrated circuit 22. More specifically, the wiring 19, of which one end is connected to the semiconductor laser chip 20, can be bump-connected to a terminal of the semiconductor chip 31.

Also, although only one semiconductor chip 31 was provided in the second embodiment, a plurality of semiconductor chips 31 can be provided as long as there is available space.

Also, the contact holes and solder bumps for connecting the semiconductor integrated circuit 22 and the semiconductor chip 31 can be formed at the same time as the contact holes 24b and the solder bumps 25 for connecting the semiconductor integrated circuit 22 and the wiring 27 on the package 26 made of ceramic. Consequently, the optoelectronic hybrid module 30 of the second embodiment can be fabricated using substantially the same manufacturing method as that of the first embodiment. That is, it is sufficient to add a step for bump-connecting the semiconductor chip 31 between the step shown in FIG. 3A and the step shown in FIG. 3B of the first embodiment.

Third Embodiment

Hereinafter, as a third embodiment of the invention, a modified example of the optoelectronic hybrid module 10 of the first embodiment is described with reference to the drawings.

Figure 5:
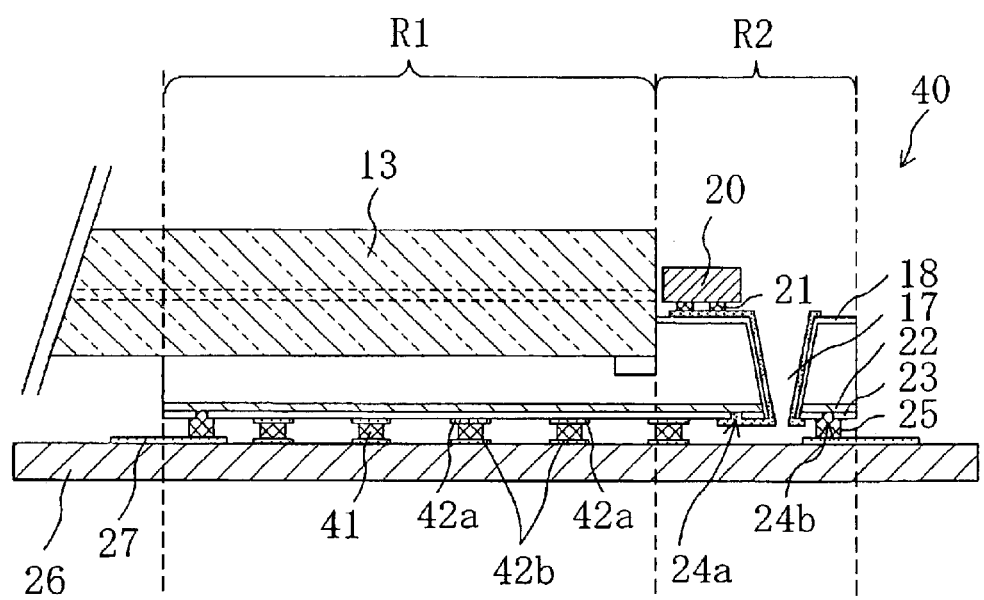
FIG. 5 is a cross-sectional view showing the optoelectronic hybrid module according to a third embodiment of the invention.

FIG. 5 is a cross-sectional view of the optoelectronic hybrid module according to the third embodiment. In FIG. 5, structural components that are identical to those shown in FIGS. 1A and 1B are assigned identical reference numerals and description thereof is omitted.

A top view of an optoelectronic hybrid module 40 according to the third embodiment is substantially identical to FIG. 1A of the first embodiment. That is, the optoelectronic hybrid module 40 according to the third embodiment has substantially the same configuration as the optoelectronic hybrid module 10 according to the first embodiment. However, comparing FIG. 1A of the first embodiment and FIG. 5 of the third embodiment shows that the optoelectronic hybrid module 40 differs from the optoelectronic hybrid module 10 of the first embodiment in that lands 42a and 42b that are not connected to the semiconductor integrated circuit 22 and to an outside circuit are formed on the passivation film 23 and the package 26 made of ceramic, and also in that the lands 42a and 42b are connected using a plurality of solder bumps 41 made of PbSn.

According to the third embodiment, PbSn, the material that is used for the solder bumps 41, has extremely high thermal conductivity, and thus heat that is generated during the operation of the semiconductor laser chip 20 and the semiconductor integrated circuit 22 can be effectively dissipated to the surface of the ceramic package 26, allowing thermal resistance to be significantly reduced. As a result, an excessive rise in temperature during operation of the optoelectronic hybrid module 40 can be prevented. Consequently, the operation of the optoelectronic hybrid module 40 is stabilized and made more reliable.

Moreover, providing numerous solder bumps 41 improves the heat dissipation properties.

It should be noted that the solder bumps 41 can be formed at the same time as the solder bumps 25 that connect the semiconductor integrated circuit 22 to the wiring 27 on the package 26 made of ceramic, and thus the optoelectronic hybrid module 40 of the third embodiment can be fabricated using the exact same manufacturing method as that of the first embodiment, obviating the need to add any particular new manufacturing steps.

There are no restrictions concerning the number of the solder bumps 41.

Fourth Embodiment

Hereinafter, as a fourth embodiment of the invention, a modified example of the optoelectronic hybrid module 10 according to the first embodiment is described with reference to the drawings.

Figure 6:
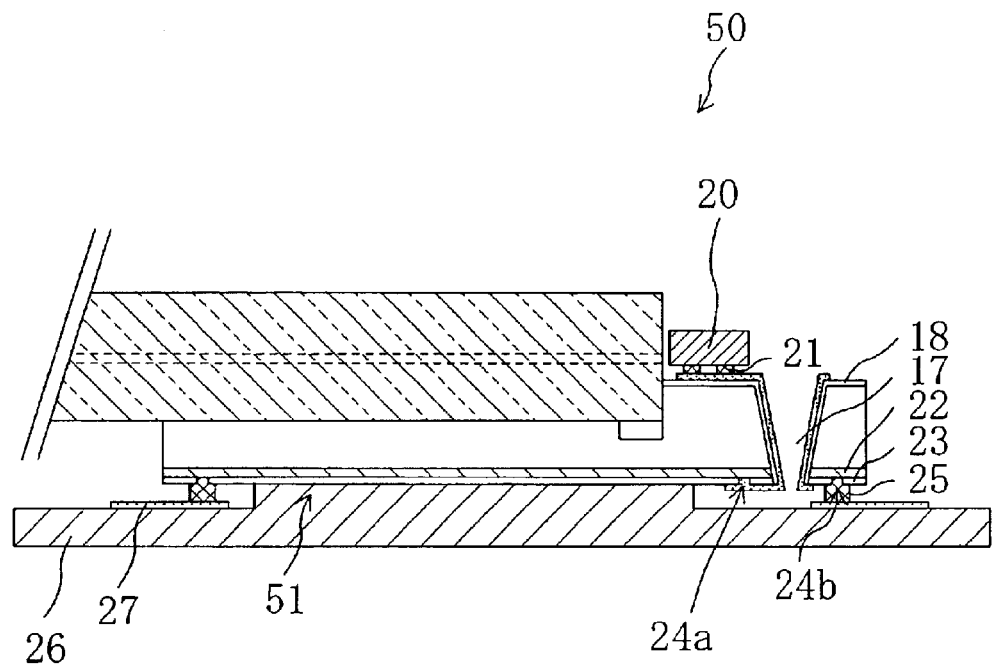
FIG. 6 is a cross-sectional view showing the optoelectronic hybrid module according to a fourth embodiment of the invention.

FIG. 6 is a cross-sectional view of the optoelectronic hybrid module according to the fourth embodiment.

A top view of an optoelectronic hybrid module 50 according to the fourth embodiment is substantially identical to FIG. 1A of the first embodiment. That is, the optoelectronic hybrid module 50 according to the fourth embodiment has substantially the same configuration as the optoelectronic hybrid module 10 according to the first embodiment. However, comparing FIG. 1A of the first embodiment and FIG. 6 of the fourth embodiment will reveal that the optoelectronic hybrid module 50 differs from the optoelectronic hybrid module 10 of the first embodiment in that a protruding portion 51 that is in contact with the passivation film 23 is provided on the package 26.

According to the fourth embodiment, the heat that is generated during the operation of the semiconductor laser chip 20 and the semiconductor integrated circuit 22 can be effectively dissipated to the surface of the ceramic package 26, allowing thermal resistance to be significantly reduced. As a result, an excessive rise in temperature during operation of the optoelectronic hybrid module 50 can be prevented. Consequently, the step of the optoelectronic hybrid module 50 is stabilized and made more reliable.

It should be noted that by preparing a ceramic package 26 provided with the protruding portion 51, the optoelectronic hybrid module 50 according to the fourth embodiment can be fabricated using the exact same method as that of the first embodiment, obviating the need for the addition of particular new manufacturing steps.

Also, the same heat dissipation effects as in the third embodiment and fourth embodiment can be achieved even if connection members in addition to the solder bumps 25 for connecting the semiconductor integrated circuit 22 and the wiring 27 are provided between the passivation film 23 and the package 26 made of ceramic, instead of the solder bumps 41 of the third embodiment and the protruding portion 51 of the fourth embodiment.

Fifth Embodiment

Hereinafter, a fifth embodiment of the invention is described with reference to FIGS. 1A and 1B.

In the first embodiment, the silicon substrate 11 is used. The specific resistance of Si ordinarily employed for semiconductor integrated circuits is low at several $\Omega$cm to several dozen $\Omega$cm. However, if the semiconductor laser chip 20 and the semiconductor integrated circuit 22 are connected by the wiring 19 and high-speed electric signals are transmitted, then the effects of dielectric loss caused by the low specific resistance of Si cannot be ignored, and transmission loss is increased. This can lead to an insufficient supply of high-frequency signals from the semiconductor integrated circuit 22 to the semiconductor laser chip 20. This problem becomes increasingly conspicuous as the frequency of signals increases. One conceivable approach to reducing dielectric loss is to increase the film thickness of the silicon oxide film 18 to at least several $\mu$m. However, in practice it is difficult to form a silicon oxide film having a film thickness of at least several dozen $\mu$m.

Accordingly, in the fifth embodiment, a silicon substrate 11 with a significantly higher Si specific resistance at 100 $\Omega$cm or more is used. This allows dielectric loss to be reduced to less than 10% of the conventional dielectric loss. More specifically, a high Si specific resistance of 100 $\Omega$cm or more can be obtained by growing the Si crystal using MCZ or FZ. As a result, the semiconductor integrated circuit 22 can adequately supply high-frequency signals to the semiconductor laser chip 20 even in high-speed signal transmission at 1 Gbps or more.

Sixth Embodiment

Hereinafter, a sixth embodiment of the invention is described using FIGS. 1A and 1B.

In the first embodiment, a silicon substrate 11 was used, however, in the sixth embodiment, a GaAs packaging substrate is used in place of the silicon substrate 11. GaAs exhibits electron-hole movement speeds several times faster than that of Si. Thus, the semiconductor integrated circuit 22 can be achieved by a transistor that is capable of operation at even higher speeds.

One indicator of transistor operating speed is the current gain cut-off frequency fT. In the case of Si, the maximum current gain cut-off frequency fT is about 20 GHz, whereas the maximum current gain cut-off frequency f of GaAs is about 100 GHz. For this reason, a semiconductor integrated circuit 22 capable of even faster signal processing can be fabricated.

Also, when a GaAs packaging substrate is used, a packaging substrate with an extremely high specific resistance of $1 \times 10^7$ $\Omega$cm or more is easily achieved, and thus the effects of dielectric loss, which is a problem for Si, become extremely small.

Consequently, with the sixth embodiment, an optoelectronic hybrid module that is several times faster than if the silicon substrate 11 is used can be obtained.

Seventh Embodiment

Hereinafter, a seventh embodiment of the invention is described using FIGS. 1A and 1B.

In the first embodiment, a silicon substrate 11 was used, however, in the seventh embodiment, an InP packaging substrate is used in place of the silicon substrate 11.

InP has even faster electron-hole movement than GaAs, and can obtain a maximum fT of about 200 GHz. For this reason, a transistor capable of higher operating speeds can be obtained.

Also, when an InP packaging substrate is used, a substrate having an extremely high specific resistance on par with that of a GaAs packaging substrate can be easily attained, and thus the effects of dielectric loss, which is a problem for Si, become extremely small.

Consequently, with the seventh embodiment, an optoelectronic hybrid module that is several times faster than the optoelectronic hybrid module of the sixth embodiment, in which a GaAs packaging substrate is used, can be obtained.

Eighth Embodiment

Hereinafter, an eighth embodiment of the invention is described with reference to the drawings.

Figure 7A:
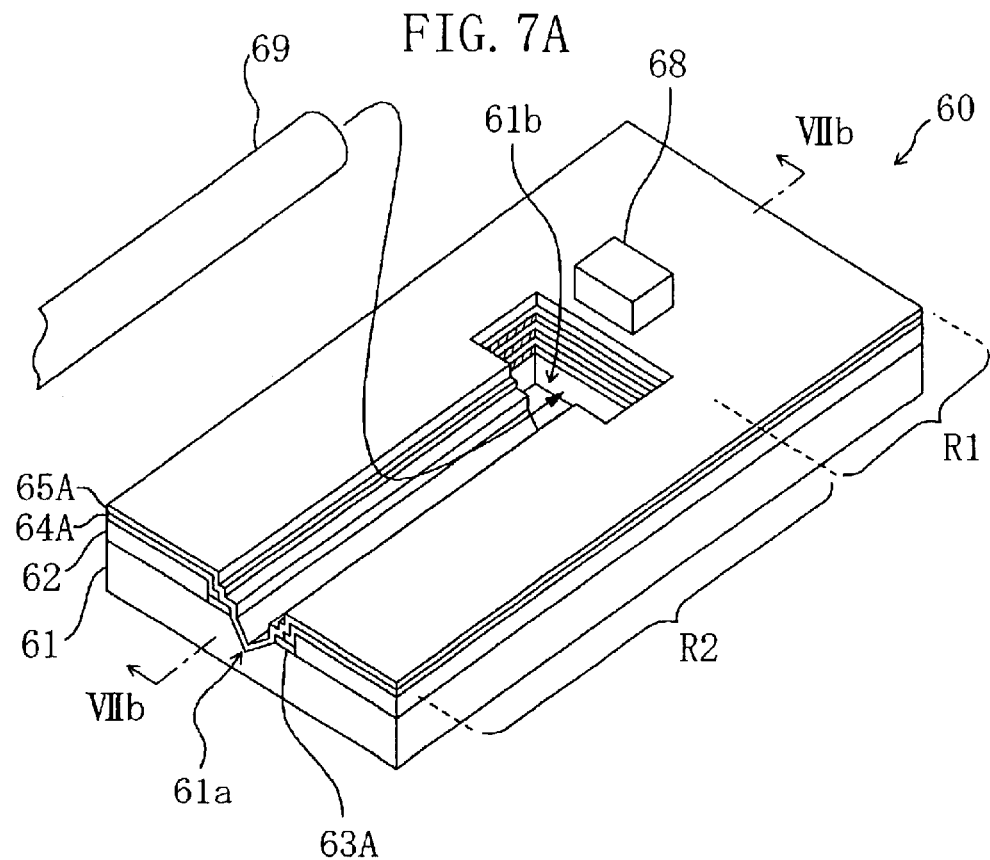
FIG. 7A is a perspective view showing the optoelectronic hybrid module according to an eighth embodiment of the invention.
Figure 7B:
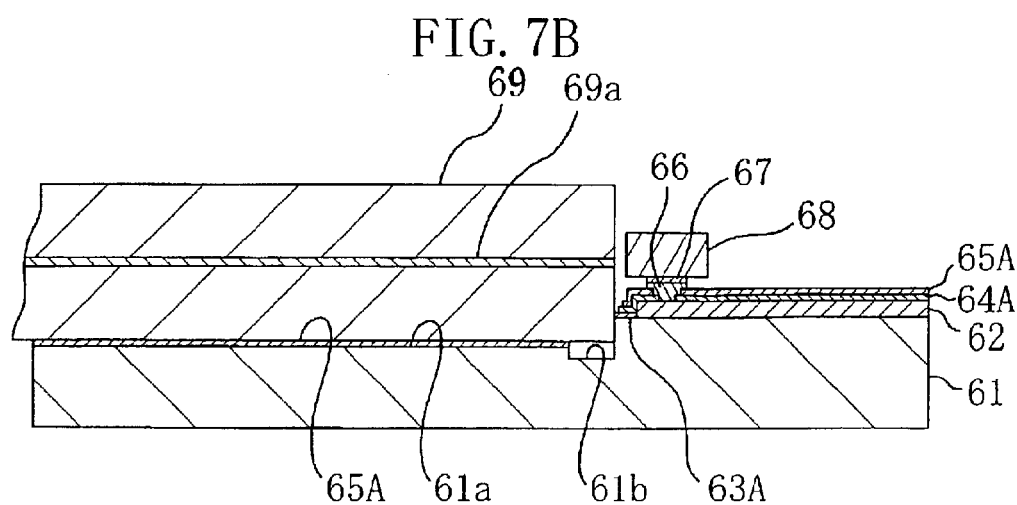
FIG. 7B is a cross-sectional view taken along the VIIb—VIIb line in FIG. 7A.

FIG. 7A is a perspective view showing the optoelectronic hybrid module according to an eighth embodiment of the invention, and FIG. 7B is a cross-sectional view taken along the line VIIb—VIIb in FIG. 7A.

As shown in FIGS. 7A and 7B, an optoelectronic hybrid module 60 according to the eighth embodiment includes a silicon substrate 61, in the upper face of which are formed a V-groove 61a, which has a V-shaped cross section, approximately 50 μm deep and extending from an end portion to a center portion of the silicon substrate 61, and an alignment recession 61b approximately 60 μm deep that at a lateral portion is connected to the end portion of the V-groove 61a on its center portion side.

Here, the V-groove 61a extends at a substantially uniform depth parallel to the upper face of the silicon substrate 61. Also, the alignment recession 61b is long rectangular and extends substantially perpendicularly to the direction in which the V-groove 61a extends, its wall face formed flat and substantially perpendicular to the upper face of the silicon substrate 61. Consequently, the wall face of the alignment recession 61b on the side opposite the V-groove 61a is substantially perpendicular to the direction in which the V-groove 61a extends.

Also, the ends of the alignment recession 61b are formed spaced from the lateral faces of the silicon substrate 61 so that the lengthwise geometry of the alignment recession 61b is greater than the width of the groove portion but smaller than the dimensions of the silicon substrate 61 in the direction that the alignment recession 61b extends. Thus, on the upper face of the silicon substrate 61, the sides of the V-groove 61a and the side of the alignment recession 61b that is opposite the V-groove 61a are contiguous in the direction in which the V-groove 61a extends.

A semiconductor integrated circuit 62, which is a peripheral circuit for controlling the light-emitting element, such as a light-emitting element drive circuit and a multiplexing circuit, is formed on the upper face of the silicon substrate 61 except at the V-groove 61a, the alignment recession 61b, and at the periphery of the V-groove 61a and the alignment recession 61b. Also, a first silicon oxide film 63A approximately 0.5 μm thick is formed at the periphery of the V-groove 61a and the alignment recession 61b. A silicon nitride film 64A, which serves as a passivation film and is approximately 0.5 μm, is formed on the semiconductor integrated circuit 62 and the first silicon oxide film 63A in order to protect the semiconductor integrated circuit 62. Furthermore, a second silicon oxide film 65A that is approximately 1 μm thick is formed on the wall face of the V-groove 61a and the silicon nitride film 64A.

A semiconductor laser chip 68 having a semiconductor laser element is formed on the semiconductor integrated circuit 62 in a region on the side of the alignment recession 61b opposite the V-groove 61a, and is connected to the semiconductor integrated circuit 62 by a land 66 and a solder bump 67 via a contact window formed in the second silicon oxide film 65A and the silicon nitride film 64A. Also, an optical fiber 69 is packaged in the V-groove 61a by passive alignment so that its end face is in contact with the wall face of the alignment recession 61b on the side that the semiconductor laser chip 68 has been formed.

More specifically, the semiconductor laser chip 68 is packaged so that the direction of its optical axis matches the direction in which the V-groove 61a extends, and the wall face of the alignment recession 61b on the side opposite the V-groove 61a is formed perpendicular to the direction in which the V-groove 61a extends. Thus, by pushing the optical fiber 69 along the V-groove 61a so that its end face comes into contact with the wall face of the alignment recession 61b, the direction of a core 69a of the optical fiber 69 is matched to the direction of the optical axis of the semiconductor laser chip 68, so that the optical fiber 69 and the semiconductor laser chip 68 are optically coupled. Also, setting the V-groove 61a to a suitable depth that corresponds to the diameter of the optical fiber 69 allows the position in the height direction of the core 69a of the optical fiber 69 to be aligned to the position of the optical axis of the semiconductor laser chip 68.

Here, the optical fiber packaging region R1 on the upper face of the silicon substrate 61 is the region in which the V-groove 61a and the alignment recession 61b are formed, and the optical element packaging region R2 on the upper face of the silicon substrate 61 is the region in which the semiconductor laser chip 68 is packaged.

Packaging with a passive alignment technique that uses the V-groove 61a and the alignment recession 61b allows the optical fiber 69 to be packaged more inexpensively than if an active alignment technique is used, in which the optical element is driven and the position of its optical axis is adjusted as it is observed. Also, because adjustment of the optical axis is controlled by the V-groove 61a and the alignment recession 61b, the optical axes of the semiconductor laser chip 68 and the optical fiber 69 can be adjusted with sub-micron precision using the V-groove 61a and the alignment recession 61b, which are formed using photolithography.

It should be noted that the semiconductor laser chip 68 is not limited to a configuration in which it includes a semiconductor laser element, and can include a light-emitting element such as a light-emitting diode element. Also, the semiconductor laser chip 68 can include a light-receiving element such as a PIN photodiode or an avalanche photodiode, and instead of the peripheral circuit for controlling a light-emitting element, such as a light-emitting element drive circuit and a multiplexing circuit, the semiconductor integrated circuit 62 can be a peripheral circuit for controlling a light-receiving element, such as a pre-amplification circuit, an equivalent amplification circuit, a timing detection circuit, an identification and reproduction circuit, and an isolation circuit. Even if the semiconductor laser chip 68 includes a light-receiving element, alignment can be performed using a passive alignment technique so that the optical axis of the optical fiber 69 and the light-receiving face of the semiconductor laser chip 68 are matched.

Figure 14A:
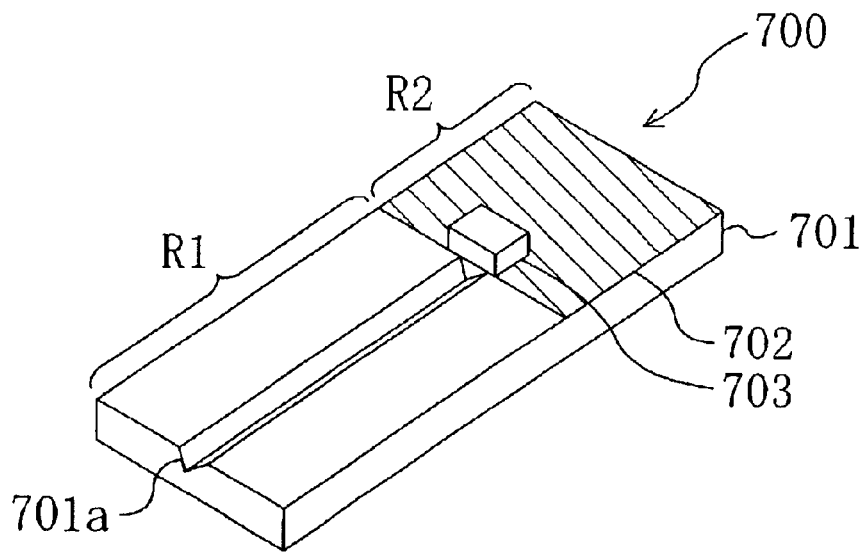
FIGS. 14A and 14B are perspective views showing an optoelectronic hybrid module according to a third conventional example.
Figure 14B:
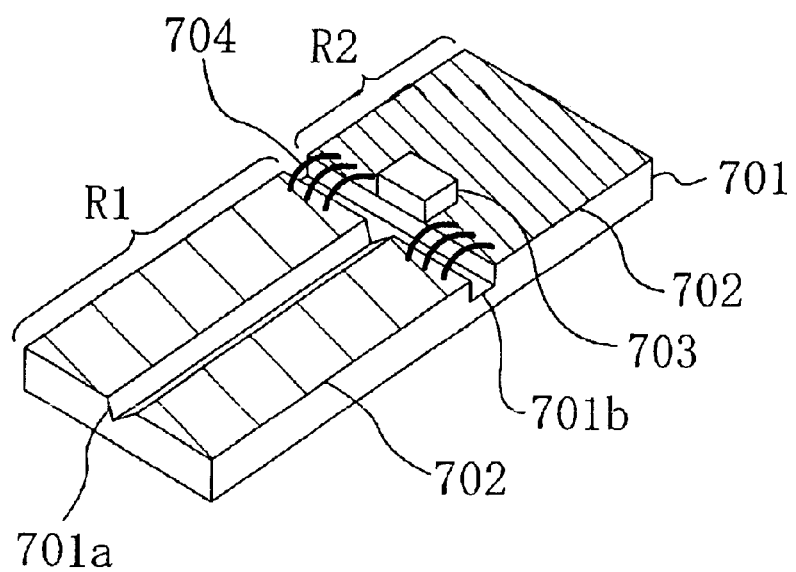

In the optoelectronic hybrid module 60 according to the eighth embodiment, the end portions of both sides of the alignment recession 61 are formed spaced from the lateral faces of the silicon substrate 61, and thus on the upper face of the silicon substrate 61 the optical fiber packaging region R1, which is the region in which the V-groove 61a and the alignment recession 61b are formed, and the optical element packaging region R2, which is the region in which the semiconductor laser chip 68 is packaged, are formed contiguous. Consequently, the semiconductor integrated circuit R2 can be formed contiguous with the optical fiber packaging region R1 and the optical element packaging region R2 in the direction of the V-groove 61a without using bonding wires, which allows for higher speeds in addition to a more compact size like the conventional optoelectronic hybrid module shown in FIG. 14B.

Moreover, because the semiconductor integrated circuit 62 is formed both in the optical fiber packaging region R1 and the optical element packaging region R2, the silicon substrate 61 can be used more efficiently than if the semiconductor integrated circuit 62 is formed in the optical element packaging region R2 only, and the optoelectronic hybrid module can be made more compact. More specifically, in a case where the area of the semiconductor integrated circuit 62 formed in the optical fiber packaging region R1 and the area of the semiconductor integrated circuit 62 formed in the optical element packaging region R2 are substantially equal, the area of the silicon substrate 61 is reduced to approximately ⅔ the area thereof if a semiconductor integrated circuit 62 with the same area as above is formed in the optical element packaging region R2 only, and this allows for a reduction in size.

Also, the manufacturing costs of the optoelectronic hybrid module 60 of the eighth embodiment are substantially proportional to the area of the silicon substrate 61, except for the costs for manufacturing the semiconductor laser chip 68, and thus if the area of the silicon substrate 61 is reduced by approximately one third, for example, then the manufacturing costs for the optoelectronic hybrid module are also curbed by approximately one third, and thus a reduction in costs is possible.

It should be noted that the alignment recession 61b is preferably formed having its side ends spaced from the lateral faces of the silicon substrate 61, but it is also possible for either of its side ends to be in contact with a lateral face of the silicon substrate 61. That is, it is only necessary that the length of the opening of the alignment recession 61b in the direction that it intersects the V-groove 61a is less than the width of the silicon substrate 61. Even in this case, on the upper face of the silicon substrate 61 one of the two regions of the optical fiber packaging region R1 to the sides of the V-groove 61a is contiguous with the optical element packaging region R2, and thus the semiconductor integrated circuit 62 is formed contiguous with the optical fiber packaging region R1 and the optical element packaging region R2.

Also, it is not necessary that the wall face of the alignment recession 61b is perpendicular to the upper face of the silicon substrate 61, as long as the wall face of the alignment recession 61b on the side opposite the V-groove 61a is formed flat and substantially perpendicular to the direction in which the V-groove 61a extends. Thus, the optical fiber 69 can be mounted with its end face in contact with the wall face of the alignment recession 61b.

Furthermore, the shape of the alignment recession 61b does not have to be long rectangular, and as long as the wall face of the alignment recession 61b on the side opposite the V-groove 61a is formed flat and substantially perpendicular to the direction in which the V-groove 61a extends, the alignment recession 61b can be formed in a square, trapezoidal, or polygonal shape. Thus, by pushing the optical fiber 69 along the V-groove 61a until its end face comes into contact with the wall face of the alignment recession 61b, the V-groove 61a and the alignment recession 61b can be employed to adjust the optical axis of the optical fiber 69 by passive alignment.

As described above, with the optoelectronic hybrid module 60 according to the eighth embodiment, the end portions of the alignment recession 61b, which is formed for the purpose of alignment, are spaced from the lateral faces of the silicon substrate 61, allowing the semiconductor integrated circuit 62 to be formed over substantially the entire surface of the silicon substrate 61 without using bonding wires, and thus a smaller, less expensive, and faster optoelectronic hybrid module 60 can be achieved.

It should be noted that in the eighth embodiment, the semiconductor integrated circuit 62 was described as formed contiguous with the optical fiber packaging region R1 and the optical element packaging region R2, however, even if the semiconductor integrated circuit 62 is separated by the sides of the alignment recession 61b into optical fiber packaging R1 and optical element packaging region R2 sections, metal wiring or the like can be formed on the upper face of the silicon substrate 61 at the sides of the alignment recession 61b in order to electrically connect the semiconductor integrated circuit 62 in the optical fiber packaging region R1 and the semiconductor integrated circuit 62 in the optical element packaging region R2. In this case as well, the parasitic impedance can be reduced over that when bonding wires are used, and the effects of faster operation can be obtained.

Also, in the eighth embodiment, it is not necessary to form all of the peripheral circuits for controlling the optical elements in the semiconductor integrated circuit 62, and for example, an optical element drive circuit can be formed in the semiconductor integrated circuit 62 and a multiplexing circuit can be packaged on the semiconductor integrated circuit 62 as a semiconductor integrated circuit. By doing this, the area of the semiconductor integrated circuit 62 can be reduced and the optoelectronic hybrid module can be made even smaller.

Manufacturing Method of Eighth Embodiment

Hereinafter, the method of manufacturing the optoelectronic hybrid module according to the eighth embodiment of the invention, having the configuration described above, is described with reference to the drawings.

FIGS. 8A to 11B show the procedure for manufacturing the optoelectronic hybrid module according to the eighth embodiment. In FIGS. 8A to 11B, components that are identical to those shown in FIGS. 7A and 7B have been assigned identical reference numerals and description thereof is omitted.

Figure 8A:
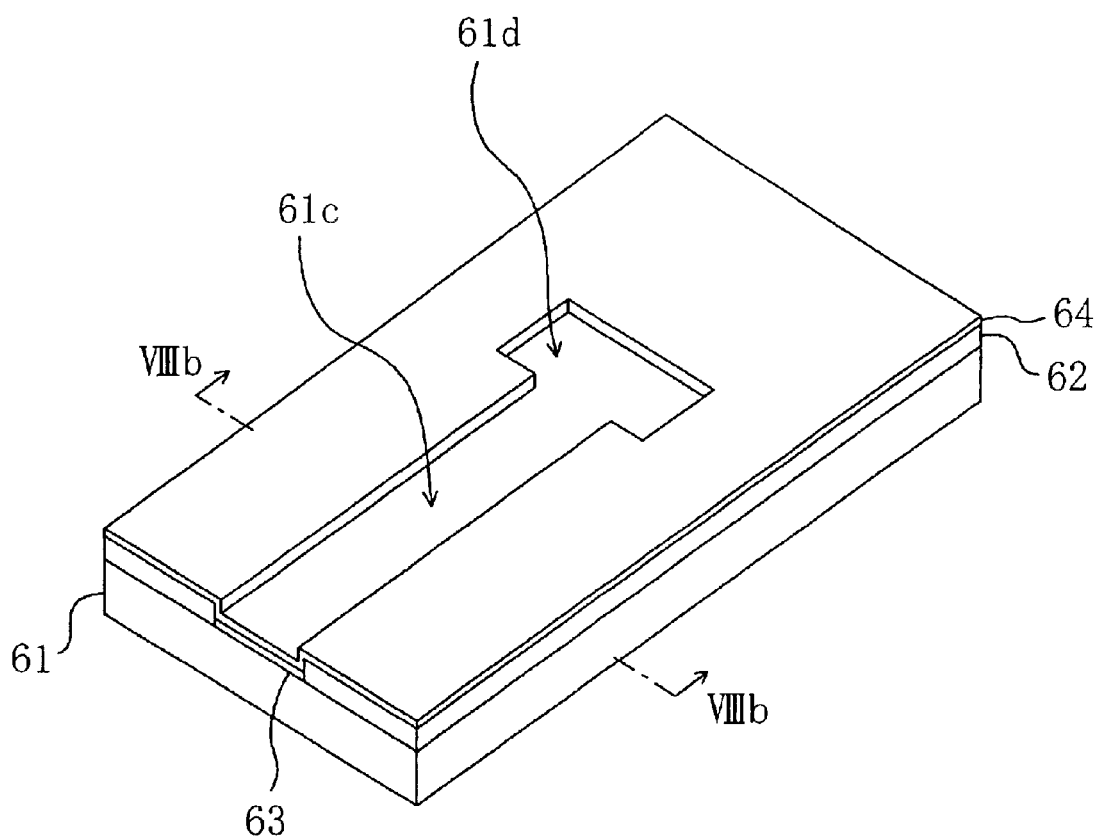
FIG. 8A is a perspective view showing steps of the method for manufacturing the optoelectronic hybrid module according to an eighth embodiment of the invention.
Figure 8B:
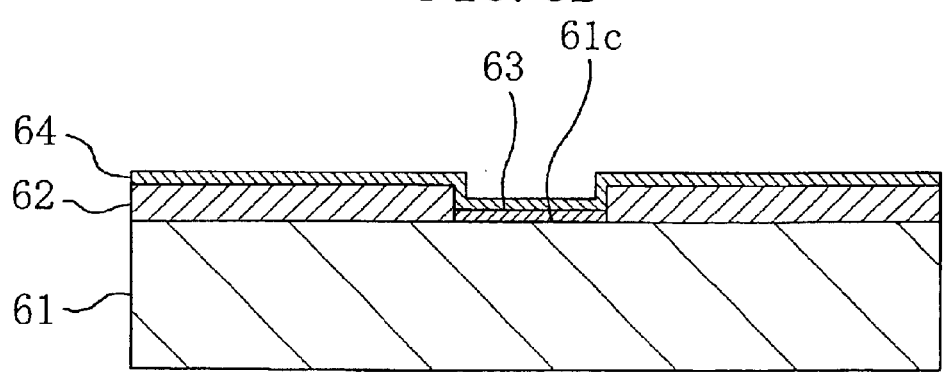
FIG. 8B is a cross-sectional view taken along the line VIIb—VIIb in FIG. 8A.
Figure 9A:
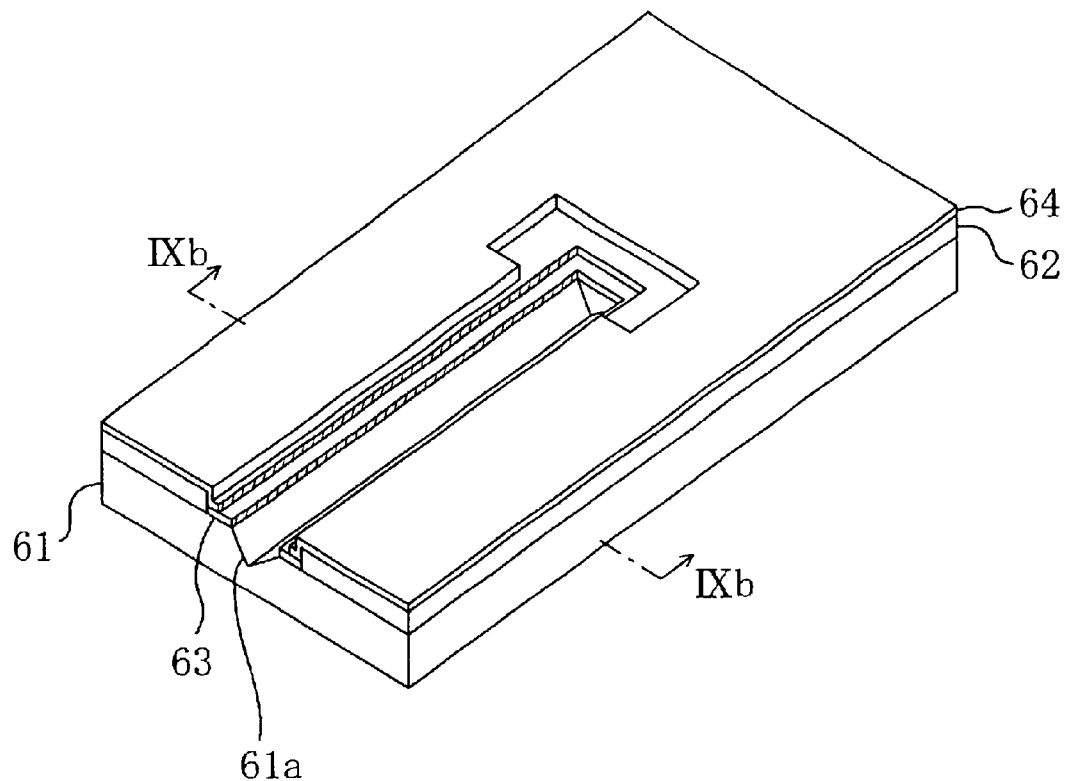
FIG. 9A is a perspective view showing steps of the method for manufacturing the optoelectronic hybrid module according to the eighth embodiment of the invention.
Figure 9B:
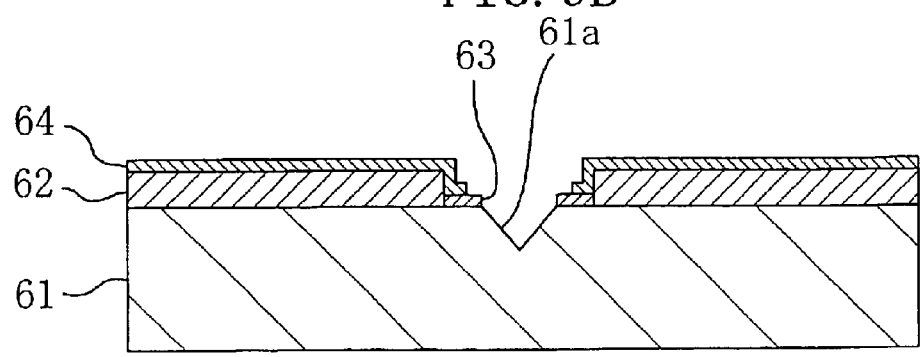
FIG. 9B is a cross-sectional view taken along the line IXb—IXb in FIG. 9A.
Figure 11A:
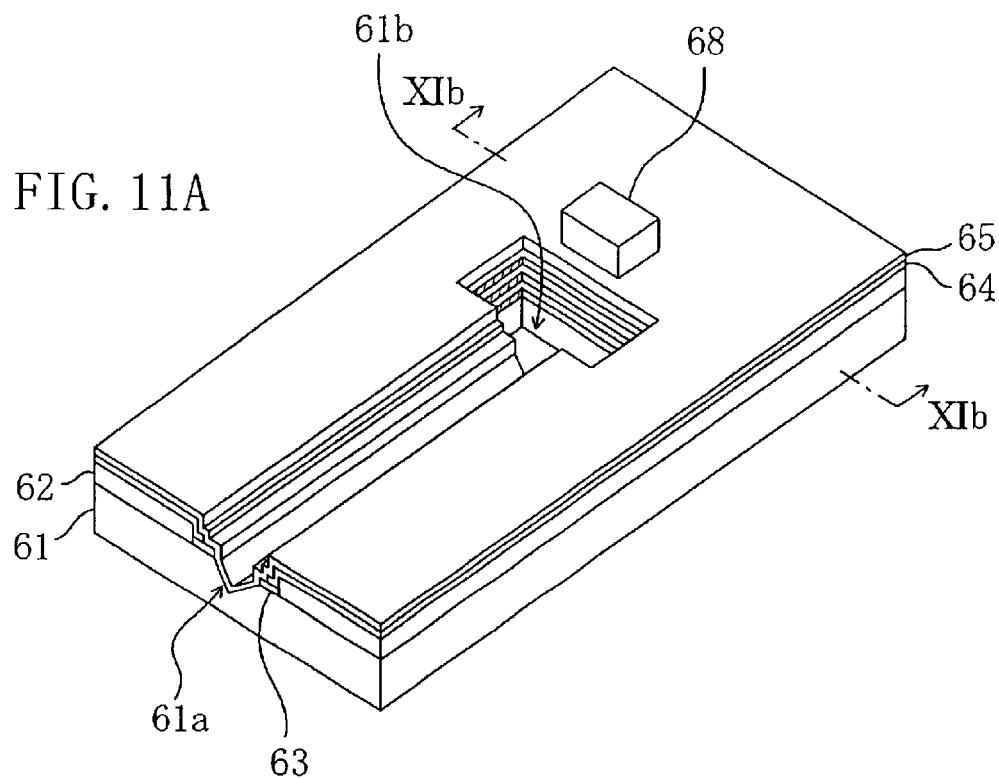
FIG. 11A is a perspective view showing steps of the method for manufacturing the optoelectronic hybrid module according to the eighth embodiment of the invention.
Figure 11B:
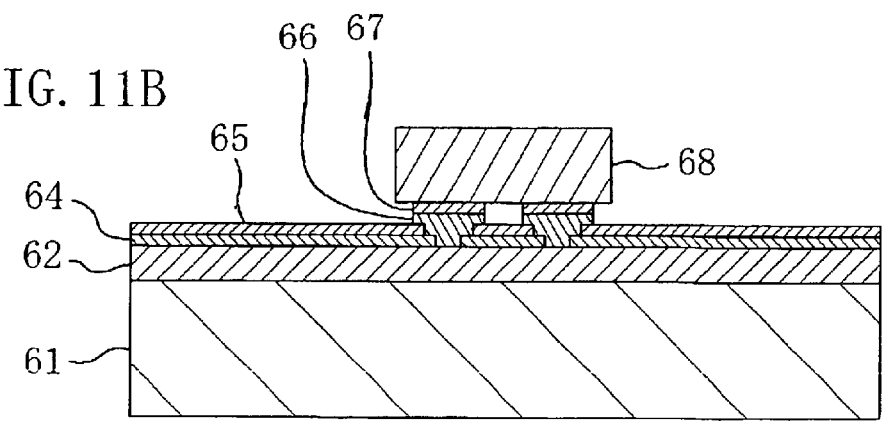
FIG. 11B is a cross-sectional view taken along the line XIb—XIb in FIG. 11A.
Figure 12:
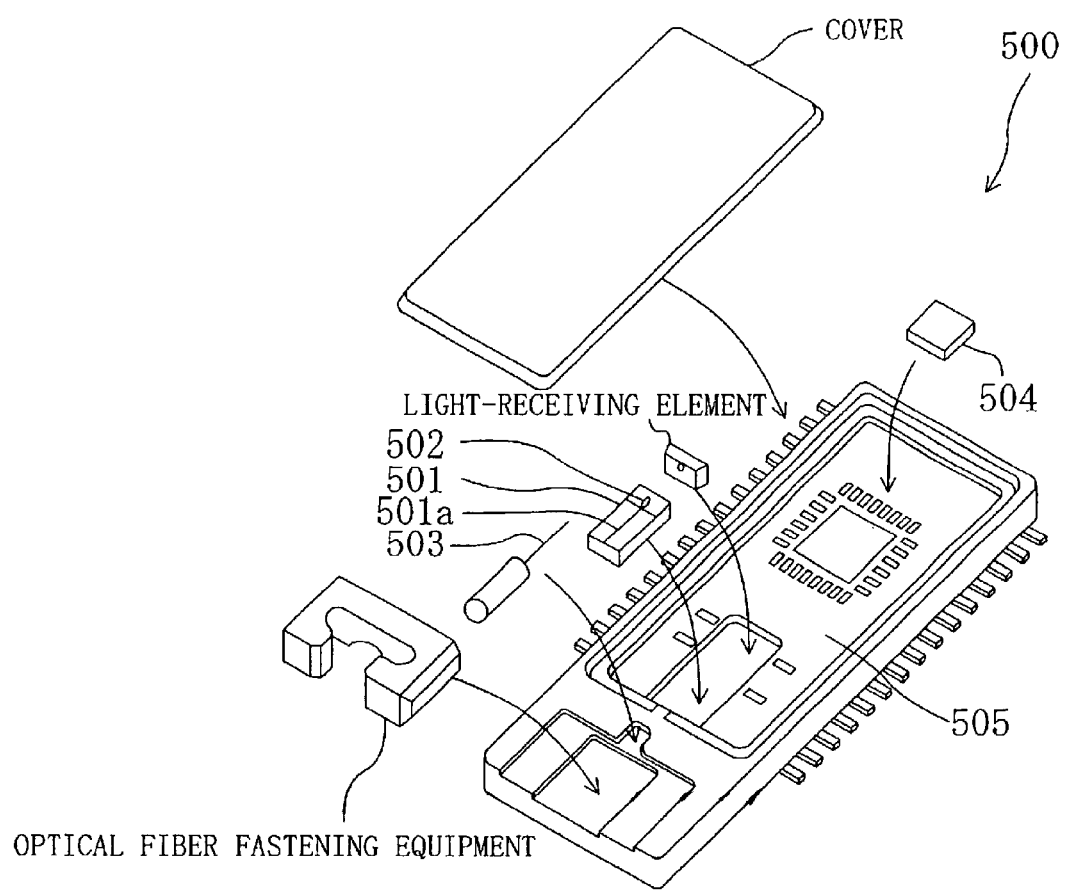
FIG. 12 is a perspective view showing an optoelectronic hybrid module according to a first conventional example.
Figure 13:
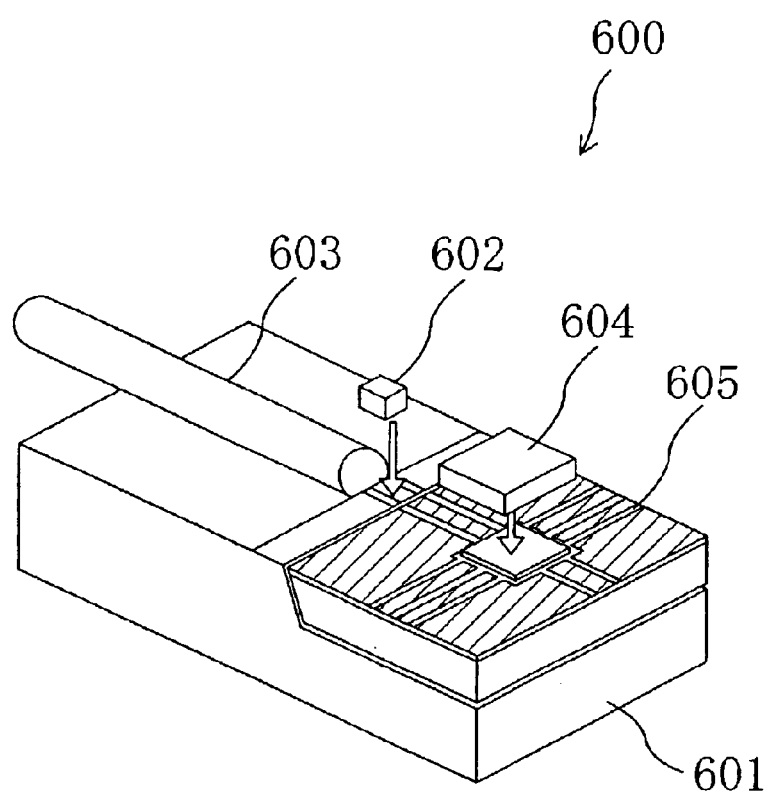
FIG. 13 is a perspective view showing an optoelectronic hybrid module according to a second conventional example.

Of FIGS. 8A to 11B, FIG. 8B shows a cross section taken along the line VIIIb—VIIIb in FIG. 8A, FIG. 9B shows a cross section taken along the line IXb—IXb in FIG. 9A, FIG. 10B shows a cross section taken along the line Xb—Xb in FIG. 10A, and FIG. 11B shows the cross section taken along the line XIb—XIb in FIG. 11A.

First, as shown in FIGS. 8A and 8B, a first mask film 63 and a semiconductor integrated circuit 62 are formed in a silicon substrate 61 that is made of silicon and has a top face orientated in the {100} face. The first mask film 63 is made of silicon oxide and is approximately 0.5 $\mu$m thick, and is formed by thermal oxidation at a V-groove formation region 61c, a recession formation region 61d, and at the periphery of the V-groove formation region 61c and the recession formation region 61d, and the semiconductor integrated circuit 62 is formed at least at regions other than the V-groove formation region 61c and the recession formation region 61d. Next, a second mask film 64 made of silicon nitride and approximately 0.5 m thick is deposited over the entire surface of the silicon substrate 61 through CVD (chemical vapor deposition).

It should be noted that the V-groove formation region 61c and the recession formation region 61d represent the regions on the upper face of the silicon substrate 61 in which the V-groove 61a and the alignment recession 61b are formed, respectively.

Here, the process for forming the semiconductor integrated circuit 62 includes a thermal oxidation process, such as forming a gate insulating film, which is a structural component of the semiconductor integrated circuit 62, by thermal oxidation of the silicon substrate 61, for example. In this thermal oxidation process, a thermal oxidation film is formed on the V-groove formation region 61*c* and the recession formation region 61*d*, and in subsequent processing, the upper portions of the V-groove formation region 61*c* and the recession formation region 61*d* are protected by a resist mask, for example, while the semiconductor integrated circuit 62 is formed, so that the first mask film 63 can be formed at the same time as the semiconductor integrated circuit 62.

Of course, it is also possible to form the semiconductor integrated circuit 62 and the first mask film 63 in separate processes. For example, after the semiconductor integrated circuit 62 has been formed, the V-groove formation region 61*c* and the recession formation region 61*d* on the silicon substrate 61 can be exposed to form the first mask film 63 by thermal oxidation, or alternatively, the semiconductor integrated circuit 62 can be formed after the first mask film 63 has been formed on the V-groove formation region 61*c* and the recession formation region 61*d*.

Next, as shown in FIGS. 9A and 9B, after the second mask film 64 positioned over the V-groove formation region 61*c* and the region peripheral thereto has been removed by photolithography and wet etching, the first mask film 63 that is exposed at the second mask film 64 is also removed to expose the silicon substrate 61 at the V-groove formation region 61*c*. Then, the silicon substrate 61 exposed at the V-groove formation region 61*c* is etched through wet etching using a potassium hydroxide (KOH) solution to form the V-groove 61*a* at a depth of approximately 50 μm.

Here, the speed at which the {111} face in particular is etched by the KOH solution is slower than other face orientations, so that etching of the silicon substrate 61 is substantially stopped at the point that the {111} face is exposed. Consequently, the V-groove 61*a* is formed in the silicon substrate 61 that is exposed at the first mask film 63 in the V-groove formation region 61*c*, and has a V-shaped cross section with the {111} face as its oblique face. The V-groove 61*a* can be formed at this time without hardly any side etching because the first mask film 63 is a thermal oxide film with extremely good adherence to the silicon substrate 61.

Also, the second mask film 64 is hardly etched by the KOH solution because it is made of silicon nitride, and thus it can reliably protect the semiconductor integrated circuit 62.

Thus, the silicon substrate 61 around the V-groove 61*a* is masked by the first mask film 63 and the semiconductor integrated circuit 62 can be protected by the second mask film 64, allowing the V-groove 61*a* to be provided with extreme precision.

Next, as shown in FIGS. 10A and 10B, first, a third mask film 65 made of silicon oxide and approximately 1 μm thick is deposited over the entire surface of the silicon substrate 61, including over the wall face of the V-groove 61*a* and the second mask film 64, using plasma CVD. Then, the third mask film 65 is patterned using photolithography and wet etching to open the upper side portion of the recession formation region 61*d* and the region around the recession formation region 61*d*. In the same fashion as above, the second mask film 64 and the first mask film 63 positioned above the recession formation region 61*d* are etched away in that order to expose the silicon substrate 61 at the recession formation region 61*d*.

Next, the silicon substrate 61 exposed at the recession formation region 61*d* is etched through a reactive ion-etching method using sulfur hexafluoride (SF$_6$), hydrogen bromide (Hbr), and oxygen as the etching gases, forming the alignment recession 61*b* to a depth of approximately 60 μm.

Here, in reactive ion etching, the silicon is quickly etched primarily through reacting with the SF$_6$ and the wall face formed by etching is protected by the product of the reaction with the HBr, so that etching can be carried out at high speeds substantially perpendicular to the upper face of the silicon substrate 61.

Also, the speed at which SF$_6$ etches silicon oxide is much slower than the speed at which it etches silicon, so that the third mask film 65 and the first mask film 63 can be used as etching masks, which allows the V-groove 61*a* and the semiconductor integrated circuit 62 to be protected by the third mask film 65 while the alignment recession 61*b* is formed in the open portion of the first mask film 63.

Thus, with ion etching using SF$_6$, HBr, and oxygen, it is possible to precisely form the alignment recession 61*b* so that it has a flat wall face that is substantially perpendicular to the upper face of the silicon substrate 61, without using a conventional dicing method. It should be noted that the etching gas for forming the alignment recession 61*b* is not limited to a combination including SF$_6$, HBr, and oxygen, as long as it is capable of high-speed etching in a substantially perpendicular direction to the upper face.

It should also be noted that the first mask film 63, the second mask film 64, and the third mask film 65 patterned in the above processes become the first silicon oxide film 63A, the silicon nitride film 64A, and the second silicon oxide film 65A, respectively.

Next, as shown in FIGS. 11A and 11B, first, the third mask film 65 and the second mask film 64 are selectively removed on the side of the alignment recession 61*b* opposite the V-groove 61*a* using photolithography and wet etching to form a contact window that exposes the semiconductor integrated circuit 62, after which lands 66 made of titanium and gold are formed over the contact window that has been formed. Next, the semiconductor laser chip 68, which includes a semiconductor laser element, is fixed and mounted to the lands 66 through flip-chip bonding using solder bumps 67 made of a gold-tin alloy.

Next, although not shown in the drawings, the optical fiber 69 is packaged in the V-groove 61*a* so that its end is in contact with the wall face of the alignment recession 61*b* opposite the V-groove 61*a*, and thus the optoelectronic hybrid module 60 of the eighth embodiment is completed. The optical axis of the optical fiber 69 is adjusted by passive alignment during packaging, and because the processing precision of the V-groove 61*a* and the alignment recession 61*b* formed as above is substantially identical to the processing precision of photolithography, the optical axis can be adjusted at sub-micron precision.

As described above, with the semiconductor device and method for manufacturing the same according to the eighth embodiment, the ends of the recessed portion that is formed for adjusting the optical axis of the optical fiber are formed spaced from the lateral faces of the semiconductor substrate, which allows the semiconductor integrated circuit to be formed continuous with the region to the sides of the groove portion and the region peripheral to the recessed portion without using bonding wires, and thus smaller, cheaper, and faster semiconductor device can be achieved.

The invention may be embodied in other forms without departing from the spirit or essential characteristics thereof The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A semiconductor device manufacturing method, comprising:
    a first step of preparing a semiconductor substrate having a first face that includes a first region and a second region and a second face in opposition to the first face;
    a second step of forming an electronic circuit on the second face side of the semiconductor substrate;
    a third step of forming an optical fiber fastening groove in the second region of the first face of the semiconductor substrate, and then forming a through hole that passes from the first face to the second face in the first region of the first face of the semiconductor substrate;
    a fourth step of forming an insulating film on the second region of the first face and on a lateral face of the through hole, and then forming a wiring on the insulating film;
    a fifth step of connecting the electronic circuit and the wiring; and
    a sixth step of connecting an optical element to the wiring formed on the second region of the first face so that its optical axis is parallel to the optical fiber fastening groove.

2. The semiconductor device manufacturing method according to claim 1, wherein in the second step, a thermal oxide film is formed on the first face of the semiconductor substrate when a thermal oxide film is formed on the second face of the semiconductor substrate, and
    in the third step, a thermal oxide film mask is formed by patterning the thermal oxide film on the upper face of the semiconductor substrate, after which the optical fiber fastening groove and the through hole are formed by wet etching using the thermal oxide film mask.

3. A semiconductor device manufacturing method, comprising:
    a first step of forming a first mask film on a groove portion formation region and a recessed portion formation region of a semiconductor substrate;
    a second step of forming an electronic circuit at a region of the semiconductor substrate other than the groove portion formation region and the recessed portion formation region;
    a third step of forming a second mask film over the entire surface of the semiconductor substrate, including over the electronic circuit and the first mask film;
    a fourth step of exposing the groove portion formation region of the semiconductor substrate by patterning the second mask film and the first mask film in that order;
    a fifth step of forming a groove portion by etching the groove portion formation region using the first mask film and the second mask film;
    a sixth step of forming a third mask film over the entire surface of the semiconductor substrate, including over the groove portion and the second mask film;
    a seventh step of exposing the recessed portion formation region of the semiconductor substrate by patterning the third mask film, the second mask film, and the first mask film in that order; and
    an eighth step of forming a recessed portion by etching the recessed portion formation region using at least the first mask film and the third mask film.

4. The semiconductor device manufacturing method according to claim 3, wherein the semiconductor substrate and the first mask film are made of silicon and silicon oxide, respectively.

5. The semiconductor device manufacturing method according to claim 4, wherein the first step is carried out together with a thermal oxidation step for forming structural components of the electronic circuit of the second step.

6. The semiconductor device manufacturing method according to claim 4, wherein the second mask film is made of silicon nitride, and the fifth step is carried out by wet etching using a potassium hydroxide solution.

7. The semiconductor device manufacturing method according to claim 4, wherein the third mask is made of silicon oxide, and the eighth step is carried out by dry etching using an etching gas that includes sulfur fluoride, hydrogen bromide, and oxygen.

* * * * *